US011276729B2

(12) United States Patent
Uchida et al.

(10) Patent No.: US 11,276,729 B2
(45) Date of Patent: Mar. 15, 2022

(54) MAGNETORESISTIVE ELEMENT AND ELECTRONIC DEVICE HAVING HIGH HEAT RESISTANCE

(71) Applicant: SONY CORPORATION, Tokyo (JP)

(72) Inventors: Hiroyuki Uchida, Kanagawa (JP); Masanori Hosomi, Tokyo (JP); Hiroyuki Ohmori, Kanagawa (JP); Kazuhiro Bessho, Kanagawa (JP); Yutaka Higo, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/078,759

(22) PCT Filed: Dec. 1, 2016

(86) PCT No.: PCT/JP2016/085795
§ 371 (c)(1),
(2) Date: Aug. 22, 2018

(87) PCT Pub. No.: WO2017/149874
PCT Pub. Date: Sep. 8, 2017

(65) Prior Publication Data
US 2019/0096957 A1    Mar. 28, 2019

(30) Foreign Application Priority Data

Mar. 1, 2016    (JP) .............................. JP2016-038778

(51) Int. Cl.
*H01L 27/22*    (2006.01)
*H01L 43/08*    (2006.01)
(Continued)

(52) U.S. Cl.
CPC ............ *H01L 27/228* (2013.01); *G01R 33/09* (2013.01); *G01R 33/093* (2013.01);
(Continued)

(58) Field of Classification Search
CPC ..... H01L 27/228; H01L 27/222; H01L 27/22; G11B 5/39–3993
(Continued)

(56) References Cited

U.S. PATENT DOCUMENTS

2004/0090822 A1 * 5/2004 Yoo ..................... B82Y 10/00
                                                    365/157
2009/0166182 A1    7/2009 Kenji
(Continued)

FOREIGN PATENT DOCUMENTS

CN         1499519         5/2004
CN         101783166       7/2010
(Continued)

OTHER PUBLICATIONS

International Search Report prepared by the Japan Patent Office dated Dec. 27, 2016, for International Application No. PCT/JP2016/085795.
(Continued)

*Primary Examiner* — Nduka E Ojeh
(74) *Attorney, Agent, or Firm* — Sheridan Ross P.C.

(57) ABSTRACT

A magnetoresistive element includes: a first laminated structure body having a first surface and a second surface 20B facing the first surface; and a second laminated structure body formed by laminating a storage layer, an intermediate layer, and a magnetization fixed layer, the second laminated structure body having a first surface and a second surface facing the first surface, the first surface being positioned facing the second surface of the first laminated structure body. The first laminated structure body has a laminated structure including, from the first surface side of the first laminated structure body, a first layer made of a metal nitride and a second layer made of ruthenium or a ruthenium compound.

16 Claims, 11 Drawing Sheets

(51) Int. Cl.
    *G01R 33/09*     (2006.01)
    *H01F 10/32*     (2006.01)
    *G11B 5/39*     (2006.01)
    *H01L 43/10*     (2006.01)
    *G11C 11/16*     (2006.01)

(52) U.S. Cl.
    CPC .............. *G01R 33/098* (2013.01); *G11B 5/39* (2013.01); *G11C 11/161* (2013.01); *H01F 10/32* (2013.01); *H01L 43/08* (2013.01); *H01L 43/10* (2013.01); *G11C 11/1659* (2013.01); *G11C 11/1675* (2013.01)

(58) Field of Classification Search
    USPC .......................................................... 257/421
    See application file for complete search history.

(56) References Cited

U.S. PATENT DOCUMENTS

| | | | | |
|---|---|---|---|---|
| 2011/0233697 | A1* | 9/2011 | Kajiyama | H01L 27/228 257/421 |
| 2012/0193736 | A1* | 8/2012 | Mather | G01R 33/098 257/421 |
| 2012/0288963 | A1* | 11/2012 | Nishimura | B82Y 10/00 438/3 |
| 2014/0077319 | A1* | 3/2014 | Noma | H01L 43/02 257/421 |
| 2014/0103469 | A1* | 4/2014 | Jan | H01L 43/08 257/421 |
| 2014/0197505 | A1* | 7/2014 | Zhou | H01L 23/552 257/422 |
| 2015/0171314 | A1* | 6/2015 | Li | H01L 43/12 257/421 |
| 2016/0163254 | A1* | 6/2016 | Lee | G11C 11/161 345/545 |
| 2018/0212140 | A1* | 7/2018 | Noh | H01L 43/10 |

FOREIGN PATENT DOCUMENTS

| | | |
|---|---|---|
| JP | 2007-294010 | 11/2007 |
| JP | 2009-158752 | 7/2009 |
| JP | 2011-204768 | 10/2011 |
| JP | 2014-060297 | 4/2014 |
| JP | 2014-072393 | 4/2014 |
| WO | WO 2011/081203 | 7/2011 |

OTHER PUBLICATIONS

Official Action (with English translation) for China Patent Application No. 201680082609.5, dated Dec. 14, 2021, 19 pages.

* cited by examiner

[Embodiment 1]

[Comparative example 1]

[Embodiment 1]

[Comparative example 1]

[Embodiment 2]

[Comparative example 2]

MAGNETORESISTIVE ELEMENT AND ELECTRONIC DEVICE HAVING HIGH HEAT RESISTANCE

CROSS REFERENCE TO RELATED APPLICATIONS

This application is a national stage application under 35 U.S.C. 371 and claims the benefit of PCT Application No. PCT/JP2016/085795 having an international filing date of 1 Dec. 2016, which designated the United States, which PCT application claimed the benefit of Japanese Patent Application No. 2016-038778 filed 1 Mar. 2016, the entire disclosures of each of which are incorporated herein by reference.

TECHNICAL FIELD

The present disclosure relates to a magnetoresistive element, more particularly, a magnetoresistive element forming, for example, a memory element, and to an electronic device including the magnetoresistive element.

BACKGROUND ART

A magnetic random access memory (MRAM) performs data storage using a magnetization direction of a magnetic body, and thus high speed and nearly unlimited ($10^{15}$ times or more) rewriting can be made, and therefore the MRAM has already been used in fields such as industrial automation and an airplane. The MRAM is expected to be used for code storage or a working memory in the near future because of the high-speed operation and high reliability. However, actually, the MRAM has challenges related to lowering power consumption and increasing capacity. This is a basic problem caused by the recording principle of the MRAM, i.e., the method of inverting the magnetization using a current magnetic field generated from wiring. As a method of solving this problem, a recording method not using the current magnetic field, i.e., a magnetization inversion method, is under review. Among them, a spin injection-type magnetoresistive effect element (spin transfer torque based magnetic random access memory; STT-MRAM) that uses magnetization inversion by spin injection attracts attention (see, e.g., Japanese Patent Application Laid-open No. 2014-072393).

The magnetization inversion by spin injection is a phenomenon in which a spin-polarized electron that has passed through a magnetic body is injected into a different magnetic body and magnetization inversion is thus caused in the different magnetic body. The spin injection-type magnetoresistive effect element uses magnetization inversion by spin injection, and thus has such advantages that a writing current is not increased even if the size of the element is reduced, scaling is possible because a writing current value is reduced in proportion to the element volume, and the cell area can be reduced, as compared with the MRAM that performs magnetization inversion on the basis of the external magnetic field. In addition, the spin injection-type magnetoresistive effect element does not need a word line for generating a recording current magnetic field, which is necessary in the MRAM, and thus has such an advantage that a device structure and a cell structure are simple.

CITATION LIST

Patent Literature

Patent Literature 1: Japanese Patent Application Laid-open No. 2014-072393

DISCLOSURE OF INVENTION

Technical Problem

Incidentally, in the manufacturing process of such a magnetoresistive element (particularly, back end of line, BEOL), temperature of approximately 400° C. may be applied to the magnetoresistive element. For that reason, there is a strong demand for a magnetoresistive element whose characteristics are not deteriorated even during exposure to such temperature.

Therefore, it is an object of the present disclosure to provide a magnetoresistive element having high heat resistance, and an electronic device including such a magnetoresistive element.

Solution to Problem

A magnetoresistive element according to the present disclosure for achieving the object described above includes: a first laminated structure body having a first surface and a second surface facing the first surface; and a second laminated structure body formed by laminating a storage layer (also referred to as a magnetization inversion layer or a free layer), an intermediate layer, and a magnetization fixed layer, the second laminated structure body having a first surface and a second surface facing the first surface, the first surface being positioned facing the second surface of the first laminated structure body, the first laminated structure body having a laminated structure including, from the first surface side of the first laminated structure body, a first layer made of a metal nitride and a second layer made of ruthenium or a ruthenium compound.

An electronic device according to the present disclosure for achieving the object described above includes the magnetoresistive element of the present disclosure. It should be noted that the electronic device of the present disclosure can also have a form including a nonvolatile memory element array including the magnetoresistive elements of the present disclosure arrayed in a two-dimensional matrix. In this case, the magnetoresistive element forms a nonvolatile memory cell.

Advantageous Effects of Invention

The magnetoresistive element of the present disclosure and the magnetoresistive element of the present disclosure forming the electronic device of the present disclosure (hereinafter, collectively referred to as a "magnetoresistive element or the like of the present disclosure" in some cases) each include the second laminated structure body having a laminated structure of the first layer made of a metal nitride and the second layer made of ruthenium or a ruthenium compound. Thus, high heat resistance can be imparted to the magnetoresistive element. In other words, even when being exposed to a high thermal load, the magnetization fixed layer can maintain good magnetic properties. Additionally, this eliminates operation errors, and thus a magnetoresistive element having a high operation margin can be provided. It should be noted that the effects described herein are merely illustrative and are not restrictive. Further, additional effects may be provided.

MODE(S) FOR CARRYING OUT THE INVENTION

Figure 1A:
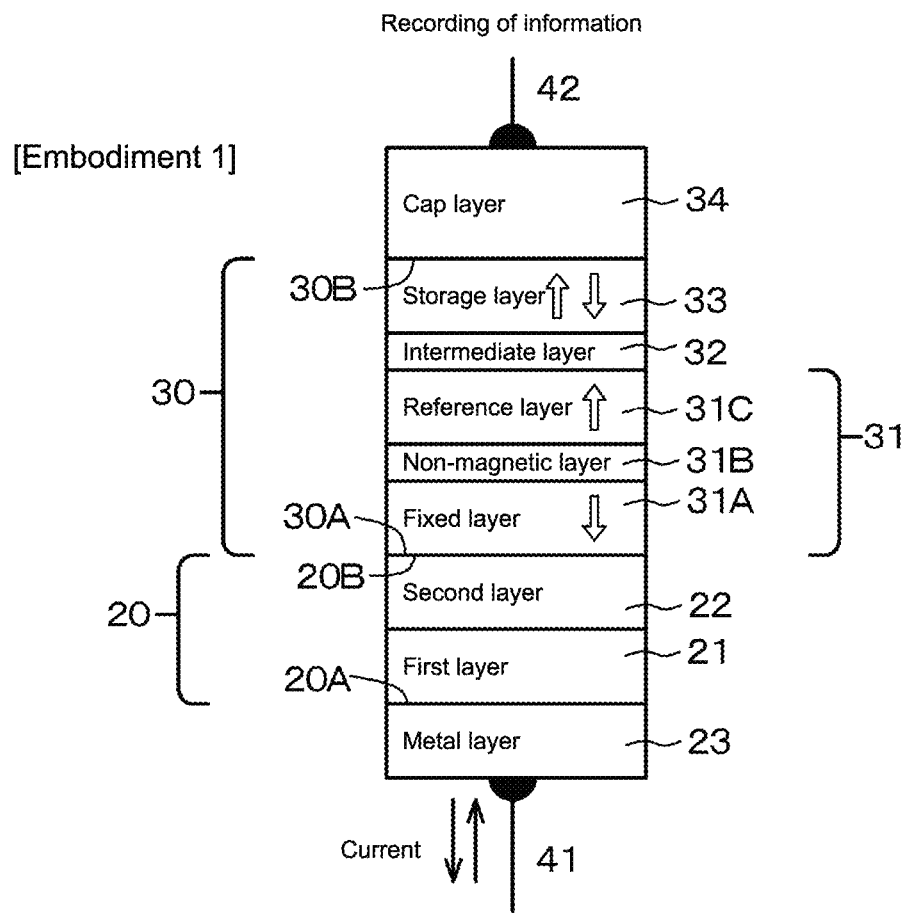
FIG. 1A and FIG. 1B are conceptual diagrams of magnetoresistive elements according to Embodiment 1 and Comparative example 1, respectively.

Hereinafter, the present disclosure will be described on the basis of embodiments with reference to the drawings. The present disclosure is not limited to the embodiments, and various numerical values and materials in the embodiments are examples. It should be noted that the description will be given in the following order.
1. Overall description on magnetoresistive element of present disclosure and electronic device of present disclosure
2. Embodiment 1 (Magnetoresistive element of present disclosure and electronic device of present disclosure)
3. Embodiment 2 (Modified example of Embodiment 1)
4. Others
<Overall Description on Magnetoresistive Element of Present Disclosure and Electronic Device of Present Disclosure>

In a magnetoresistive element or the like of the present disclosure, a magnetization fixed layer can be positioned on the first surface side of the second laminated structure body, but the magnetization fixed layer is not limited to such a form, and a storage layer can be positioned on the first surface side of the second laminated structure body. In other words, as a whole, the magnetization fixed layer can have a structure laminating a first layer made of a metal nitride/a second layer made of ruthenium or a ruthenium compound/a magnetization fixed layer/an intermediate layer/a storage layer, or can have a structure laminating a first layer made of a metal nitride/a second layer made of ruthenium or a ruthenium compound/a storage layer/an intermediate layer/a magnetization fixed layer. Further, in the magnetoresistive element or the like of the present disclosure, the second surface of the first laminated structure body and the first surface of the second laminated structure body face each other, but specifically, the second surface of the first laminated structure body and the first surface of the second laminated structure body can be brought into contact with each other.

In the magnetoresistive element or the like of the present disclosure including the favorable mode described above, a metal layer can be formed in contact with the first surface of the first laminated structure body. In this case, the first layer of the first laminated structure body and the metal layer can include an identical metal element. Specifically, examples of a combination of (a material forming the first layer and a material forming the metal layer) include (VN, V), (CrN, Cr), (NbN, Nb), (MoN, Mo), (TaN, Ta), (WN, W), (CuN, Cu), and (TiN, Ti).

Moreover, in the magnetoresistive element or the like of the present disclosure including the various favorable modes described above, the ruthenium compound (containing a ruthenium alloy) can include at least one type of element or an element group selected from the group consisting of titanium, zirconium, hafnium, nickel, copper, chromium, nickel-iron, nickel-iron-chromium, and nickel-chromium.

Moreover, in the magnetoresistive element or the like of the present disclosure including the various favorable modes described above, the magnetization fixed layer can have a laminated ferrimagnetic structure (also referred to as laminated ferri-pinned structure) including at least two laminated magnetic material layers. One of the magnetic material layers forming the laminated ferrimagnetic structure is referred to as "reference layer" in some cases, and another one of the magnetic material layers forming the laminated ferrimagnetic structure is referred to as "fixed layer" in some cases. The magnetization direction of the reference layer is a magnetization direction to be a reference of information to be stored in the storage layer. The one of the magnetic material layers forming the laminated ferrimagnetic structure (reference layer) is positioned on the storage layer side. In this case, the one of the magnetic material layers forming the laminated ferrimagnetic structure (e.g., reference layer) can include at least one type of element selected from the group consisting of iron (Fe), cobalt (Co), and nickel (Ni), or include at least one type of element selected from the group consisting of iron (Fe), cobalt (Co), and nickel (Ni), and boron (B), and the other one of the magnetic material layers forming the laminated ferrimagnetic structure (e.g., fixed layer) can be formed of a material including, as a main component, at least one type of element <for the sake of convenience, referred to as "element-A"> selected from the group consisting of iron (Fe), cobalt (Co), nickel (Ni), and manganese (Mn), and including at least one type of element (which is an element different from the element-A described above) selected from the group consisting of platinum (Pt), palladium (Pd), nickel (Ni), manganese (Mn), iridium (Ir), and rhodium (Rh). The laminated ferrimagnetic structure is employed in the magnetization fixed layer, and thus asymmetry of heat stability to an information write direction can be reliably cancelled, and stability to a spin torque can be improved.

The laminated ferrimagnetic structure is a laminated structure having antiferromagnetic coupling, i.e., a structure in which interlayer exchange coupling between the two magnetic material layers (reference layer and fixed layer) becomes antiferromagnetic, which is also referred to as synthetic antiferromagnetic coupling (SAF: Synthetic Antiferromagnet). The laminated ferrimagnetic structure represents a structure in which, depending on the thickness of a non-magnetic layer provided between the two magnetic material layers (reference layer and fixed layer), interlayer exchange coupling between the two magnetic material layers becomes antiferromagnetic or ferromagnetic. This structure is reported by, for example, S. S. Parkin et al., in Physical Review Letters, 7 May, pp. 2304-2307 (1990). As a ferromagnetic material, specifically, Co, Ni, Fe, a Co—Fe alloy, a Co—Fe—Ni alloy, an Ni—Fe alloy, and a Co—Fe—B alloy can be exemplified, and laminated structures of an Fe layer/Pt layer, an Fe layer/Pd layer, a Co layer/Pt layer, a Co layer/Pd layer, a Co layer/Ni layer, and a Co layer/Rh layer can also be exemplified. Alternatively, a non-magnetic element such as Ag, Cu, Au, Al, Si, Bi, Ta, B, C, O, N, Pd, Pt, Zr, Ta, Hf, Ir, W, Mo, Nb, V, Ru, or Rh may be added to those above materials to adjust magnetic properties or adjust various physical properties such as a crystalline structure, crystallinity, and stability of substances. As a material forming the non-magnetic layer, ruthenium (Ru), an alloy thereof, and a ruthenium compound can be exemplified. Alternatively, Os, Re, Ir, Au, Ag, Cu, Al, Bi, Si, B, C, Cr, Ta, Pd, Pt, Zr, Hf, W, Mo, Nb, V, Rh, and an alloy thereof can be exemplified.

Further, the magnetization fixed layer can be formed such that the orientation of the magnetization thereof is fixed by using only the ferromagnetic layer or by using antiferromagnetic coupling between an antiferromagnetic layer and a ferromagnetic layer. As an antiferromagnetic material, specifically, an Fe—Mn alloy, an Fe—Pt alloy, an Ni—Mn alloy, a Pt—Mn alloy, a Pt—Cr—Mn alloy, an Ir—Mn alloy, an Rh—Mn alloy, a Co—Pt alloy, a cobalt oxide, a nickel oxide (NiO), and an iron oxide ($Fe_2O_3$) can be exemplified. Alternatively, a non-magnetic element such as Ag, Cu, Au, Al, Si, Bi, Ta, B, C, O, N, Pd, Pt, Zr, Ta, Hf, Ir, W, Mo, Nb, V, Ru, or Rh may be added to those above materials to adjust magnetic properties or adjust various physical properties such as a crystalline structure, crystallinity, and stability of substances. As a material forming the non-magnetic layer, ruthenium (Ru), an alloy thereof, and a ruthenium compound can be exemplified. Alternatively, Os, Re, Ir, Au, Ag, Cu, Al, Bi, Si, B, C, Cr, Ta, Pd, Pt, Zr, Hf, W, Mo, Nb, V, Rh, and an alloy thereof can be exemplified.

It should be noted that the laminated ferrimagnetic structure can further include, between the one magnetic material layer forming the laminated ferrimagnetic structure and the second laminated structure body, a non-magnetic material layer including at least one type of element selected from the group consisting of vanadium, chromium, niobium, molybdenum, tantalum, tungsten, hafnium, zirconium, titanium, and ruthenium.

Note that the magnetization fixed layer is not limited to the form having the laminated ferrimagnetic structure. The magnetization fixed layer can also be a magnetization fixed layer formed of one layer and functioning as a reference layer. Examples of a material forming such a magnetization fixed layer include a material forming a storage layer to be described later (ferromagnetic material). Alternatively, the magnetization fixed layer (reference layer) can be formed of a laminated body of a Co layer and a Pt layer, a laminated body of a Co layer and a Pd layer, a laminated body of a Co layer and an Ni layer, a laminated body of a Co layer and a Tb layer, a Co—Pt alloy layer, a Co—Pd alloy layer, a Co—Ni alloy layer, a Co—Fe alloy layer, a Co—Tb alloy layer, a Co layer, an Fe layer, or a Co—Fe—B alloy layer. Alternatively, a non-magnetic element such as Ag, Cu, Au, Al, Si, Bi, Ta, B, C, O, N, Pd, Pt, Zr, Hf, Ir, W, Mo, Nb, V, Ru, or Rh may be added to those above materials to adjust magnetic properties or adjust various physical properties such as a crystalline structure, crystallinity, and stability of substances. Furthermore, it is favorable that the magnetization fixed layer (reference layer) can be formed of a Co—Fe—B alloy layer.

Because the magnetization direction of the magnetization fixed layer is a reference of information, the magnetization direction should not change by recording or reading of information. However, the magnetization direction does not necessarily need to be fixed in a specific direction, and the magnetization fixed layer only needs to have a configuration and structure where the magnetization direction of the magnetization fixed layer is harder to change than that of the recording layer by having a larger coercive force, a larger film thickness, or a larger magnetic damping constant than those of the recording layer.

Moreover, in the magnetoresistive element or the like of the present disclosure including the various favorable modes described above, the storage layer can be formed of a metal material (alloy, compound) including cobalt, iron, and nickel or of a metal material (alloy, compound) including cobalt, iron, nickel, and boron.

Alternatively, as a material forming the storage layer, an alloy of the ferromagnetic material such as nickel (Ni), iron (Fe), or cobalt (Co) (e.g., Co—Fe, Co—Fe—B, Co—Fe—Ni, Fe—Pt, Ni—Fe, Fe—B, or Co—B) or an alloy in which gadolinium (Gd) is added to an alloy of those above materials can be exemplified. Moreover, in order to further increase perpendicular magnetic anisotropy in a perpendicular magnetization method, heavy rare earth elements such as terbium (Tb), dysprosium (Dy), and holmium (Ho) may be added to such an alloy, or an alloy including them may be laminated. The crystallinity of the storage layer is essentially arbitrary and may be polycrystalline, monocrystalline, or amorphous. Further, the storage layer can have a single-layer configuration, a laminated configuration in which the plurality of different ferrimagnetic material layers described above are laminated, or a laminated configuration in which the ferrimagnetic material layer and the non-magnetic body layer are laminated.

Further, it is also possible to add a non-magnetic element to the material forming the storage layer. By addition of the non-magnetic element, effects such as improvement in heat resistance due to prevention of diffusion, an increase in magnetoresistive effect, and an increase in dielectric breakdown voltage associated with planarization are obtained. As the non-magnetic element to be added, B, C, N, O, F, Li, Mg, Si, P, Ti, V, Cr, Mn, Ni, Cu, Ge, Nb, Ru, Rh, Pd, Ag, Ta, Ir, Pt, Au, Zr, Hf, W, Mo, Re, and Os can be exemplified.

Moreover, it is also possible to laminate, as the storage layer, ferrimagnetic material layers having different compositions. Alternatively, it is also possible to laminate a ferrimagnetic material layer and a soft magnetic material layer or laminate a plurality of ferrimagnetic material layers via the soft magnetic material layer or the non-magnetic body layer.

In particular, in a case where a plurality of ferrimagnetic material layers such as an Fe layer, a Co layer, an Fe—Ni alloy layer, a Co—Fe alloy layer, a Co—Fe—B alloy layer, an Fe—B alloy layer, and a Co—B alloy layer are laminated via the non-magnetic body layer, a relationship of the magnetic strength between the ferrimagnetic material layers is adjustable, and thus it is possible to suppress an increase in magnetization inversion current (also referred to as spin polarization current) in a spin injection-type magnetoresistive effect element. Examples of a material forming the non-magnetic body layer include Ru, Os, Re, Ir, Au, Ag, Cu, Al, Bi, Si, B, C, Cr, Ta, Pd, Pt, Zr, Hf, W, Mo, Nb, V, and an alloy thereof.

As the thickness of the storage layer, a thickness of 0.5 nm to 30 nm can be exemplified, and as the thickness of the magnetization fixed layer, a thickness of 0.5 nm to 30 nm can be exemplified.

Moreover, in the magnetoresistive element or the like of the present disclosure including the various favorable modes described above, it is favorable that the intermediate layer is formed of a non-magnetic body material. In other words, in the spin injection-type magnetoresistive effect element, it is favorable that, in a case of forming the second laminated structure body having a TMR (Tunnel Magnetoresistance) effect, the intermediate layer is formed of an insulating material and also of a non-magnetic body material. In other words, formation of the second laminated structure body having the TMR effect by the magnetization fixed layer, the intermediate layer, and the storage layer refers to a structure in which an intermediate layer formed of a non-magnetic body material film functioning as a tunnel insulating film is sandwiched between the magnetization fixed layer formed of a magnetic material and the storage layer formed of a magnetic material. Here, examples of the material being an insulating material and also a non-magnetic body material include various insulating materials, dielectric materials, and semiconductor materials, such as a magnesium oxide (MgO), a magnesium nitride, a magnesium fluoride, an aluminum oxide ($AlO_X$), an aluminum nitride (AlN), a silicon oxide ($SiO_X$), a silicon nitride (SiN), $TiO_2$, $Cr_2O_3$, Ge, NiO, $CdO_X$, $HfO_2$, $Ta_2O_5$, $Bi_2O_3$, CaF, $SrTiO_2$, $AlLaO_2$, Mg—$Al_2$—O, Al—N—O, BN, and ZnS. It is favorable that the intermediate layer formed of the insulating material has an area resistance value approximately equal to or less than several tens of $\Omega \cdot \mu m^2$. In a case where the intermediate layer is formed of a magnesium oxide (MgO), it is desirable that the MgO layer is crystallized, and it is more desirable that the MgO layer has crystal orientation in the (001) direction. Further, in a case where the intermediate layer is formed of a magnesium oxide (MgO), it is desirable that the MgO layer has a thickness of 1.5 nm or less. Meanwhile, examples of a material forming a non-magnetic body material film forming the second laminated structure body having a giant magnetoresistance (GMR) effect include an electrically conductive material such as Cu, Ru, Cr, Au, Ag, Pt, or Ta, and an alloy thereof. If the material has high electrical conductivity (whose resistance is not more than several hundreds of $\mu\Omega \cdot cm$), any non-metal material may be used. It is desirable to appropriately select a material that has a difficulty in causing an interface reaction with the storage layer or the magnetization fixed layer.

The intermediate layer being an insulating material and also being formed of a non-magnetic body material can be obtained by, for example, oxidizing or nitriding the metal layer formed by a sputtering method. More specifically, in a case where an aluminum oxide ($AlO_X$) or a magnesium oxide (MgO) is used as the insulating material forming the intermediate layer, for example, a method of oxidizing aluminum or magnesium formed by a sputtering method in the atmosphere, a method of plasma-oxidizing aluminum or magnesium formed by a sputtering method, a method of oxidizing aluminum or magnesium formed by a sputtering method with IPC plasma, a method of naturally oxidizing aluminum or magnesium formed by a sputtering method in oxygen, a method of oxidizing aluminum or magnesium formed by a sputtering method with an oxygen radical, a method of applying ultraviolet rays when naturally oxidizing aluminum or magnesium formed by a sputtering method in oxygen, a method of depositing aluminum or magnesium by a reactive sputtering method, and a method of depositing an aluminum oxide ($AlO_X$) or a magnesium oxide (MgO) by a sputtering method can be exemplified.

Moreover, in the magnetoresistive element or the like of the present disclosure including the various favorable modes described above, in order to prevent interdiffusion of atoms forming a connection portion or a wire (electrode) to be described later and atoms forming the storage layer, reduce contact resistance, and prevent the oxidation of the storage layer, a cap layer can be formed in contact with the second surface of the second laminated structure body. In this case, the cap layer can have a single-layer structure including at least one type of material selected from the group consisting of hafnium, tantalum, tungsten, zirconium, niobium, molybdenum, titanium, vanadium, chromium, magnesium, ruthenium, rhodium, palladium, and platinum, a single-layer structure including an oxide such as a magnesium oxide layer, an aluminum oxide layer, a titanium oxide layer, a silicon oxide layer, a $Bi_2O_3$ layer, an $SrTiO_2$ layer, an $AlLaO_3$ layer, an Al—N—O layer, a Mg—Ti—O layer, and a $MgAl_2O_4$ layer, or a laminated structure (e.g., Ru layer/Ta layer) including at least one type of material layer selected from the group consisting of hafnium, tantalum, tungsten, zirconium, niobium, molybdenum, titanium, vanadium, chromium, magnesium, ruthenium, rhodium, palladium, and platinum, and at least one type of oxide layer selected from the group consisting of MgTiO, MgO, AlO, and SiO.

Moreover, in the magnetoresistive element or the like of the present disclosure including the various favorable modes described above, a magnetization direction of the storage layer can change depending on information to be stored, and an easy axis of magnetization of the storage layer can be parallel to a lamination direction of the second laminated structure body (i.e., perpendicular magnetization type). In this case, the magnetoresistive element can be a spin injection-type magnetoresistive effect element of a perpendicular magnetization method. Moreover, in those cases, the first surface of the first laminated structure body can be connected to a first wire (including the concept of a first electrode), the second surface of the second laminated structure body can be connected to a second wire (including the concept of a second electrode), and a current (magnetization inversion current described above) can be supplied between the first wire and the second wire, and information can be stored in the storage layer. In other words, the magnetization inversion current is supplied in the lamination direction of the second laminated structure body, and thus the magnetization direction of the storage layer can be changed and recording of information can be performed in the storage layer.

Moreover, in the magnetoresistive element or the like of the present disclosure including the various favorable modes described above, the following expression is satisfied, though not limited thereto: $B/A \leq 0.05$, where a value of a diffraction peak intensity of a (002) plane is A, and a value of a diffraction peak intensity of a (012) plane is B, the values being obtained on the basis of an X-ray diffraction method for the second layer of the first laminated structure body.

The various layers described above can be formed by, for example, a sputtering method, an ion beam deposition method, physical vapor deposition (PVD methods) exemplified by a vacuum evaporation method, or chemical vapor deposition (CVD methods) typified by an atomic layer deposition (ALD) method. Further, the patterning of those layers can be performed by a reactive ion etching method (RIE method) or an ion milling method (ion beam etching method). It is favorable that various layers are successively formed in a vacuum apparatus, and after that, patterning is performed on the layers.

Figure 11A:
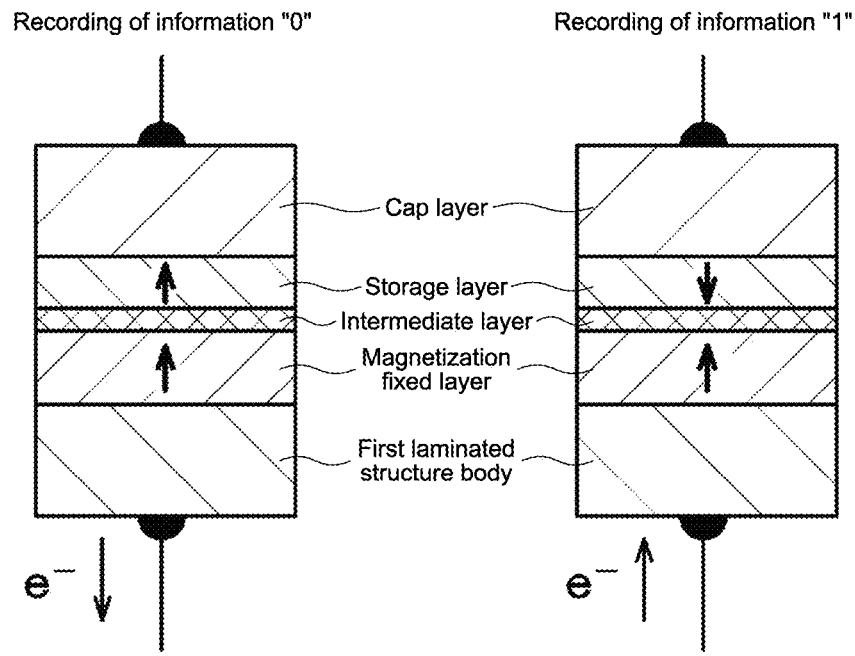
FIG. 11A and FIG. 11B are a conceptual diagram of a spin injection-type magnetoresistive effect element to which spin injection magnetization inversion is applied, and a conceptual diagram showing a spin injection-type magnetoresistive effect element having a double spin filter structure, respectively.
Figure 11B:
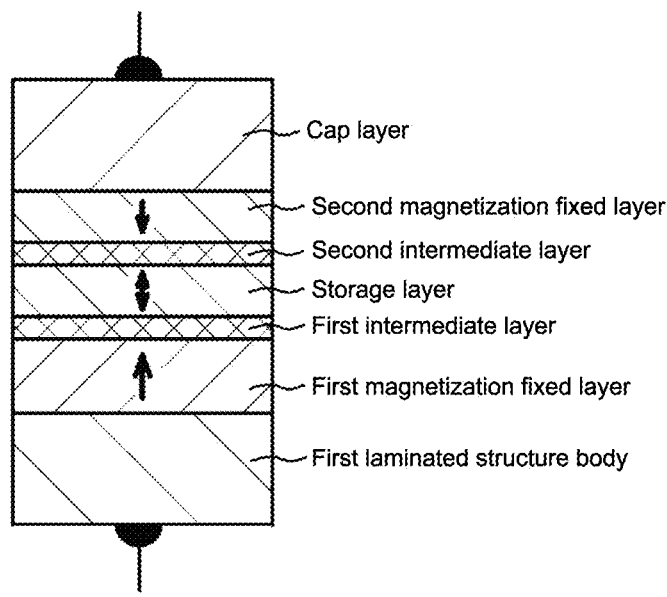

As described above, the magnetoresistive element of the present disclosure can have the structure in which the laminated structure body having the TMR effect or GMR effect is formed by the second laminated structure body including the storage layer, the intermediate layer, and the magnetization fixed layer. As shown in a conceptual diagram of FIG. 11A, when a magnetization inversion current (spin polarization current, write current) is supplied from the storage layer to the magnetization fixed layer in a magnetized state of the antiparallel arrangement, the magnetization of the storage layer is inverted by a spin torque that acts when electrons are injected from the magnetization fixed layer into the storage layer, and the magnetization direction of the storage layer, the magnetization direction of the magnetization fixed layer (specifically, reference layer), and the magnetization direction of the storage layer are in a parallel array. Meanwhile, when the magnetization inversion current is supplied from the magnetization fixed layer to the storage layer in a magnetized state of the parallel arrangement, the magnetization of the storage layer is inverted by a spin torque that acts when electrons flow from the storage layer to the magnetization fixed layer, and the magnetization direction of the storage layer and the magnetization direction of the magnetization fixed layer (specifically, reference layer) are in an antiparallel array. Alternatively, as shown in a conceptual diagram of FIG. 11B, the second laminated structure body having the TMR effect or GMR effect can also have the structure including the magnetization fixed layer, the intermediate layer, the storage layer, the intermediate layer, the magnetization fixed layer. In such a structure, it is necessary to differentiate the change in magnetoresistance of the two intermediate layers positioned on the top and bottom of the storage layer.

The three-dimensional shape of each of the first laminated structure body and the second laminated structure body is desirably a cylindrical shape or a columnar shape from a viewpoint of ensuring the easiness of processing and the uniform direction of an easy axis of magnetization in the storage layer, but the three-dimensional shape is not limited thereto and may be a triangular prism shape, a quadrangular prism shape, a hexagonal prism shape, an octagonal prism shape (including those having rounded lateral sides or lateral ridges), or an elliptic cylinder shape. An area of each of the first laminated structure body and the second laminated structure body is favorably, for example, 0.01 $\mu m^2$ or less from the viewpoint of easy reversal of the orientation of the magnetization by a low magnetization inversion current. By supplying the magnetization inversion current to the second laminated structure body from the first wire to the second wire or from the second wire to the first wire, the magnetization direction in the storage layer is set to a first direction (direction in parallel with easy axis of magnetization) or a second direction (direction in parallel with direction opposite to first direction), to write information in the storage layer. In order to improve the crystallinity of the magnetic material layer forming a part of the second laminated structure body brought into contact with the second electrode, a base film made of Ta, Cr, Ru, Ti, or the like may be formed between the second laminated structure body and the second wire.

The first wire or the second wire may have a single-layer structure of Cu, Al, Au, Pt, Ti, or the like. Alternatively, the first wire or the second wire may have a laminated structure including a base layer made of Cr, Ti, or the like and a Cu layer, an Au layer, a Pt layer, or the like formed thereon. Moreover, the first wire or the second wire may have a single-layer structure of Ta or the like, or a laminated structure of such a layer with Cu, Ti, or the like. Those wires (electrodes) can be formed by, for example, a PVD method exemplified by a sputtering method.

The magnetoresistive element or the like of the present disclosure includes a selection transistor formed of an electric field effect transistor on the lower side of the first laminated structure body and the second laminated structure body. A projected image in a direction in which the second wire (e.g., bit line) extends can be orthogonal to a projected image in a direction in which a gate electrode (also functioning as, for example, word line or address line) forming the field-effect transistor extends, and a direction in which the second wire extends can be in parallel with the direction in which the gate electrode forming the field-effect transistor extends. Further, depending on circumstances, the selection transistor is unnecessary.

In a favorable configuration of the magnetoresistive element, as described above, the selection transistor formed of the field-effect transistor is further provided on the lower side of the laminated structure bodies. As a more specific configuration, though not limited thereto, for example, the magnetoresistive element includes: a selection transistor formed on a semiconductor substrate; and a first interlayer insulating layer (lower layer/interlayer insulating layer) that covers the selection transistor.

A first wire is formed on the first interlayer insulating layer.

The first wire is electrically connected to one of the source/drain regions of the selection transistor via a connection hole (or via a connection hole and a landing pad portion or lower-layer wiring) provided to the first interlayer insulating layer.

A second interlayer insulating layer (upper layer/interlayer insulating layer) covers the first interlayer insulating layer and the first wire.

An insulating material layer that surrounds the first laminated structure body and the second laminated structure body is formed on the second interlayer insulating layer.

The first laminated structure body is electrically connected to another one of the source/drain regions of the selection transistor via a connection hole (or via a connection hole and a landing pad portion or lower-layer wiring) provided to the first interlayer insulating layer and the second interlayer insulating layer.

A second wire brought into contact with the second laminated structure body is formed on the insulating material layer.

The selection transistor can be formed of, for example, a well-known MIS FET or MOS FET. The connection hole that electrically connects the first wire and the selection transistor to each other and the first laminated structure body and the selection transistor to each other can be formed of polysilicon doped with impurities, a high-melting-point metal such as tungsten, Ti, Pt, Pd, Cu, TiW, TiNW, $WSi_2$, and $MoSi_2$, or a metal silicide, and can be formed by a CVD method or a PVD method exemplified by a sputtering method. Further, examples of the material forming the first interlayer insulating layer, the second interlayer insulating layer, and the insulating material layer include a silicon dioxide ($SiO_2$), a silicon nitride (SiN), SiON, SOG, NSG, BPSG, PSG, BSG, LTO, and $Al_2O_3$.

As an electronic device of the present disclosure, portable electronic devices such as a mobile device, a game console, a music device, and a video device, and stationary electronic devices can be exemplified, or a magnetic head can also be exemplified. Further, a storage device formed of a nonvolatile memory element array including the magnetoresistive elements of the present disclosure (specifically, memory elements, and more specifically, nonvolatile memory cells) arrayed in a two-dimensional matrix can also be exemplified.

Embodiment 1

Embodiment 1 relates to a magnetoresistive element of the present disclosure, more specifically, a magnetoresistive element forming, for example, a memory element (nonvolatile memory cell), and to an electronic device of the present disclosure.

Incidentally, for example, in a structure in which a storage layer made of a Co-based material or Fe-based material is laminated on an intermediate layer (tunnel insulating layer) made of MgO, when a thermal load of 350° C. or higher is applied, magnetic properties largely deteriorate. In a normal semiconductor memory manufacturing process, a thermal load of approximately 400° C. is applied to the memory element in a CVD step or the like. Thus, achieving a magnetic tunnel junction (MTJ) configuration and a magnetic material layer capable of maintaining sufficiently favorable magnetic properties with respect to a thermal load of approximately 400° C. is a very important task.

FIG. 1A shows a conceptual diagram of a magnetoresistive element 10 of Embodiment 1. In the figure, a magnetization direction is shown by a white arrow. The magnetoresistive element 10 of Embodiment 1 includes a first laminated structure body 20 having a first surface 20A and a second surface 20B facing the first surface 20A, and a second laminated structure body 30 formed by laminating a storage layer (also referred to as magnetization inversion layer or free layer) 33, an intermediate layer 32, and a magnetization fixed layer 31, the second laminated structure body 30 having a first surface 30A and a second surface 30B facing the first surface 30A, the first surface 30A being positioned facing (specifically, being in contact with) the second surface 20B of the first laminated structure body 20. Additionally, the first laminated structure body 20 has a laminated structure including, from the first surface 20A side of the first laminated structure body 20, a first layer 21 made of a metal nitride and a second layer 22 made of ruthenium (Ru) or a ruthenium compound (specifically, for example, a ruthenium (Ru)-cobalt (Co) alloy). Further, in the magnetoresistive element 10 of Embodiment 1, the magnetization fixed layer 31 is positioned on the first surface 30A side of the second laminated structure body 30. In other words, as a whole, the magnetization fixed layer 31 has a structure laminating the first layer 21 made of a metal nitride/the second layer 22 made of ruthenium or a ruthenium compound/the magnetization fixed layer 31/the intermediate layer 32/the storage layer 33. It should be noted that the second surface 20B of the first laminated structure body 20 and the first surface 30A of the second laminated structure body 30 face each other, but specifically, the second surface 20B of the first laminated structure body 20 and the first surface 30A of the second laminated structure body 30 are brought into contact with each other.

Further, an electronic device of Embodiment 1 includes the magnetoresistive element of Embodiment 1. Specifically, the electronic device of Embodiment 1 includes a nonvolatile memory element array including the magnetoresistive elements of Embodiment 1 arrayed in a two-dimensional matrix. The magnetoresistive element forms a nonvolatile memory cell.

Additionally, in the magnetoresistive element 10 of Embodiment 1, a metal layer 23 is further formed in contact with the first surface 20A of the first laminated structure body 20. The first layer 21 of the first laminated structure body 20 and the metal layer 23 includes an identical metal element. Specifically, a material forming the first layer 21 was TaN, and a material forming the metal layer 23 was Ta. The metal layer 23 is formed on a second interlayer insulating layer 68 made of $SiO_2$.

The magnetization fixed layer 31 has a laminated ferrimagnetic structure (also referred to as laminated ferri-pinned structure) including at least two laminated magnetic material layers. A non-magnetic layer 31B made of ruthenium (Ru) is formed between one of the magnetic material layers (reference layer) 31C forming the laminated ferrimagnetic structure and the other one of the magnetic material layers (fixed layer) 31A forming the laminated ferrimagnetic structure.

The storage layer 33 is formed of a ferromagnetic material having a magnetic moment in which the magnetization direction freely changes in the lamination direction of the second laminated structure body 30, more specifically, formed of a Co—Fe—B alloy [$(Co_{20}Fe_{80})_{80}B_{20}$]. The intermediate layer 32 formed of a non-magnetic body material is formed of an insulating layer functioning as a tunnel barrier layer (tunnel insulating layer), specifically, formed of a magnesium oxide (MgO) layer. When the intermediate layer 32 is formed of an MgO layer, a magnetoresistance change ratio (MR ratio) can be increased. This can improve the efficiency of the spin injection and reduce a magnetization inversion current density that is necessary for inverting the magnetization direction of the storage layer 33. Moreover, a cap layer 34 is formed in contact with the second surface of the second laminated structure body 30.

Moreover, in the magnetoresistive element of Embodiment 1, the magnetization direction of the storage layer 33 changes depending on information to be stored. Additionally, in the storage layer 33, the easy axis of magnetization is parallel to the lamination direction of the second laminated structure body 30 (i.e., perpendicular magnetization type). In other words, the magnetoresistive element of Embodiment 1 is formed of a spin injection-type magnetoresistive effect element of a perpendicular magnetization method. In other words, the magnetoresistive element of Embodiment 1 is formed of an MTJ element. The magnetization direction of the reference layer 31C is a reference magnetization direction of information to be stored in the storage layer 33, and information "0" and information "1" are defined by relative angles of the magnetization direction of the storage layer 33 and the magnetization direction of the reference layer 31C.

The first surface 20A of the first laminated structure body 20 is connected to a first wire 41, and the second surface 30B of the second laminated structure body 30 is connected to a second wire 42 (more specifically, the second surface 30B of the second laminated structure body 30 is connected to the second wire 42 via the cap layer 34). When a current (magnetization inversion current) is supplied between the first wire 41 and the second wire 42, information is stored in the storage layer 33. In other words, when the magnetization inversion current is supplied in the lamination direction of the second laminated structure body 30, the magnetization direction of the storage layer 33 is changed, so that information recording is performed in the storage layer 33. In such a manner, the easy axis of magnetization of the reference layer 31C is parallel to the lamination direction of the second laminated structure body 30. In other words, the reference layer 31C is formed of a ferromagnetic material having a magnetic moment in which the magnetization direction changes in a direction parallel to the lamination direction of the second laminated structure body 30, more specifically, formed of a Co—Fe—B alloy [$(Co_{20}Fe_{80})_{80}B_{20}$]. Moreover, a fixed layer 31A is formed of a Co—Pt alloy layer and forms a laminated ferrimagnetic structure that magnetically couples with the reference layer 31C via the non-magnetic layer 31B made of ruthenium (Ru).

The three-dimensional shape of each of the first laminated structure body 20 and the second laminated structure body 30 is a cylindrical shape (columnar shape) or a quadrangular shape, but the three-dimensional shape is not limited thereto.

The various layer configurations described above are shown in the following Table 1.

TABLE 1

| | |
|---|---|
| Cap layer 34 | Laminate of Ta layer with film thickness of 1 nm and Ru layer with film thickness of 5 nm |
| Second laminated structure 30 | |
| Storage layer 33 | $(Co_{20}Fe_{80})_{80}B_{20}$ layer with film thickness of 1.6 nm |
| Intermediate layer 32 | MgO layer with film thickness of 1.0 nm |
| Magnetization fixed layer 31 | |
| Reference layer 31C | $(Co_{20}Fe_{80})_{80}B_{20}$ layer with film thickness of 1.0 nm |
| Non-magnetic layer 31B | Ru layer with film thickness of 0.8 nm |
| Fixed layer 31A | Co—Pt alloy layer with film thickness of 2.5 nm |
| First laminated structure 20 | |
| Second layer 22 | Ru layer with film thickness of 5 nm |
| First layer 21 | TaN layer with film thickness of 5 nm |
| Metal layer 23 | Ta layer with film thickness of 5 nm |

Figure 2A:
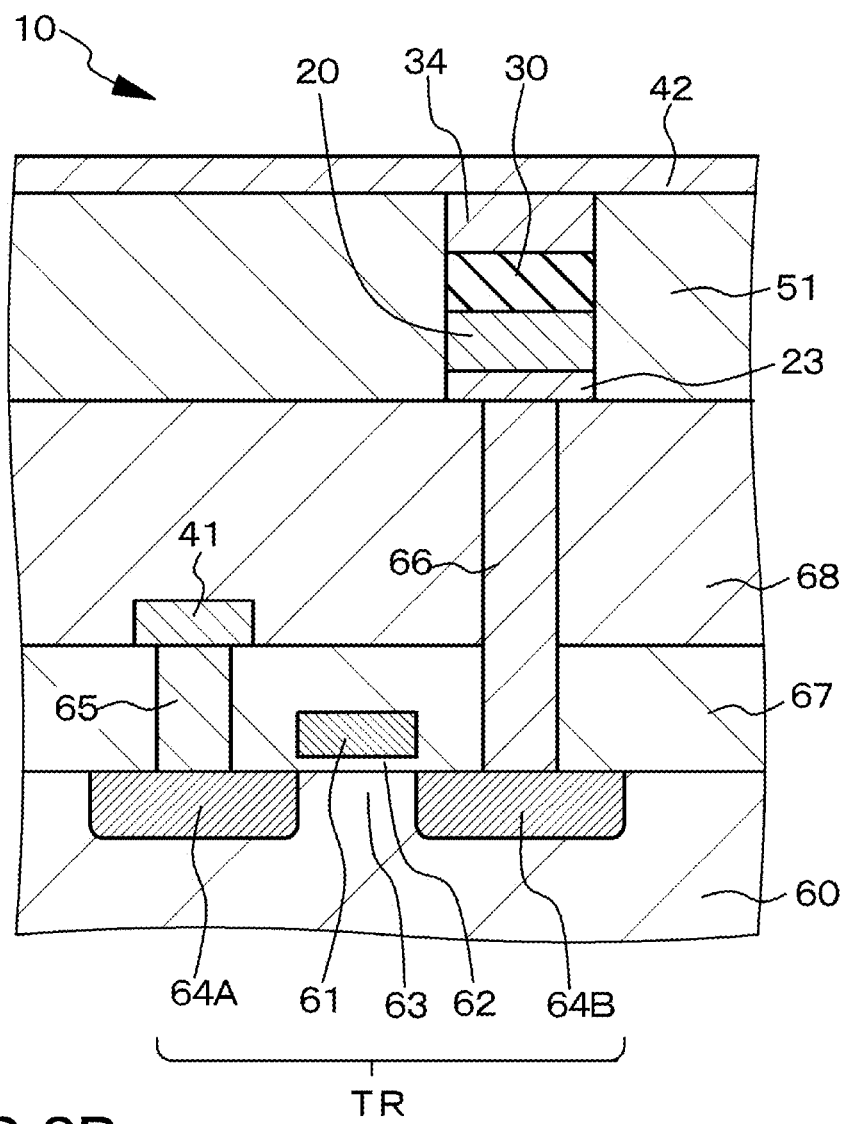
FIG. 2A and FIG. 2B are a schematic partial cross-sectional view of the magnetoresistive element (spin injection-type magnetoresistive effect element) of Embodiment 1 including a selection transistor, and an equivalent circuit diagram, respectively.
Figure 2B:
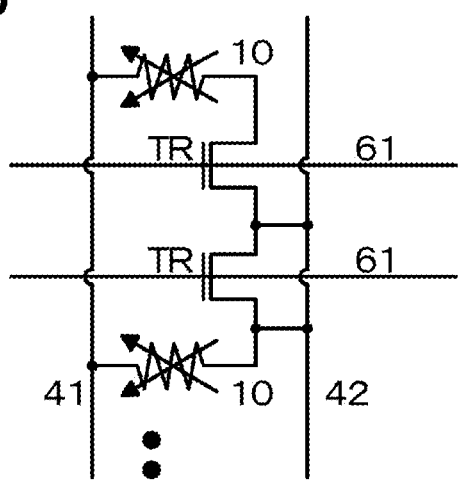
Figure 3:
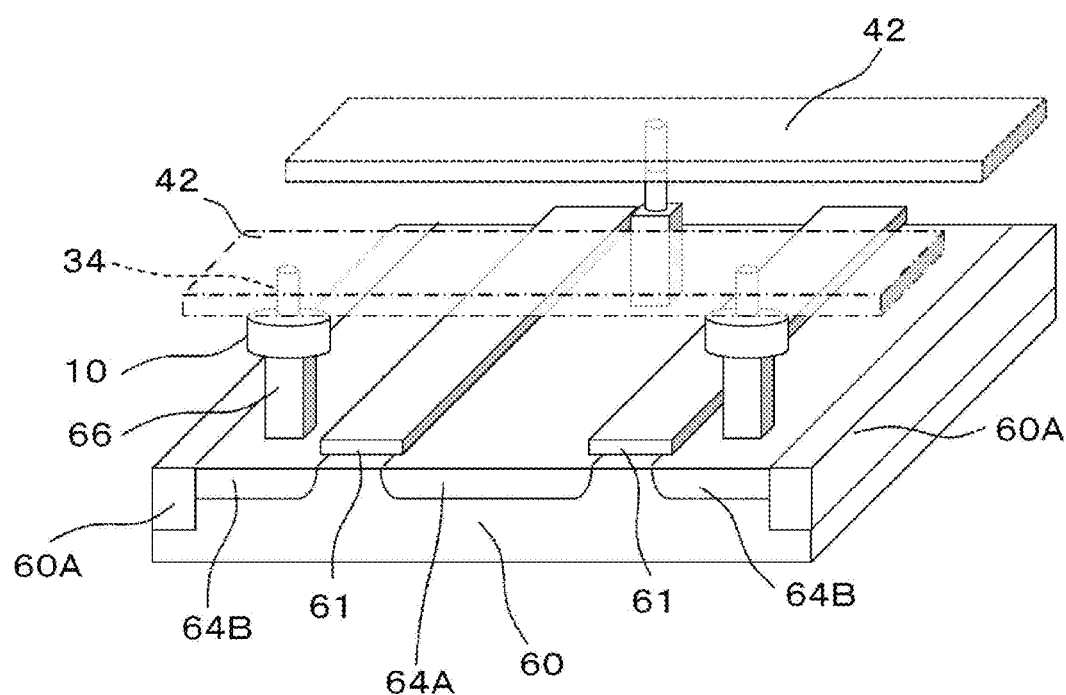
FIG. 3 is a schematic perspective view of the magnetoresistive element (spin injection-type magnetoresistive effect element) of Embodiment 1 including the selection transistor.

FIG. 2A shows a schematic partial cross-sectional view of the magnetoresistive element (spin injection-type magnetoresistive effect element) of Embodiment 1 including a selection transistor, and FIG. 2B shows an equivalent circuit diagram. As shown in a schematic perspective view of FIG. 3, a selection transistor TR formed of a field-effect transistor is provided on the lower side of the first laminated structure body 20. Specifically, the magnetoresistive element includes: a selection transistor TR formed on a semiconductor substrate 60; and a first interlayer insulating layer 67 that covers the selection transistor TR.

A first wire 41 is formed on the first interlayer insulating layer 67.

The first wire 41 is electrically connected to one source/drain region 64A of the selection transistor TR via a connection hole (or via a connection hole and a landing pad portion or lower-layer wiring) 66 provided to the first interlayer insulating layer 67.

A second interlayer insulating layer 68 covers the first interlayer insulating layer 67 and the first wire 41.

An insulating material layer 51 that surrounds the first laminated structure body 20 and the second laminated structure body 30 is formed on the second interlayer insulating layer 68.

The first laminated structure body 20 is electrically connected to the other source/drain region 64B of the selection transistor via the connection hole 66 provided to the first interlayer insulating layer 67 and the second interlayer insulating layer 68.

A second wire 42 brought into contact with the second laminated structure body 30 is formed on the insulating material layer 51.

The selection transistor TR includes a gate electrode 61, a gate insulating layer 62, a channel forming region 63, and the source/drain regions 64A, 64B. The one source/drain region 64A and the first wire 41 are connected to the first wire (sense line) 41 formed on the first interlayer insulating layer 67 via a tungsten plug 65, as described above. Further, the other source/drain region 64B is connected to the first laminated structure body 20 via the connection hole 66. The gate electrode 61 functions as a so-called word line or address line as well. Additionally, a projected image in a direction in which the second wire (bit line) 42 extends is orthogonal to a projected image in a direction in which the gate electrode 61 extends, and is parallel to a projected image in a direction in which the first wire 41 extends. Note that, in FIG. 2A, for simplicity of the figure, those directions are different from directions in which the gate electrode 61, the first wire 41, and the second wire 42 extend.

Hereinafter, the general outline of a method of manufacturing the magnetoresistive element of Embodiment 1 will be described.

[Process-100]

First, on the basis of a well-known method, an element isolation region 60A is formed in the silicon semiconductor substrate 60, and the selection transistor TR including a gate oxide film 62, a gate electrode 61, and source/drain regions 64A, 64B is formed at a portion of the silicon semiconductor substrate 60, which is surrounded by the element isolation region 60A. A portion of the silicon semiconductor substrate 60, which is positioned between the source/drain region 64A and the source/drain region 64B, corresponds to the channel forming region 63. Next, the first interlayer insulating layer 67 is formed, and the tungsten plug 65 is formed at a portion of the first interlayer insulating layer 67 on the upper side of the one source/drain region 64A. Moreover, the first wire 41 is formed on the first interlayer insulating layer 67. Subsequently, the second interlayer insulating layer 68 is formed on the entire surface, and the connection hole 66 including a tungsten plug is formed at a portion of the first interlayer insulating layer 67 and the second interlayer insulating layer 68 on the upper side of the other source/drain region 64B. In this way, the selection transistor TR covered with the first interlayer insulating layer 67 and the second interlayer insulating layer 68 can be obtained.

[Process-110]

Subsequently, the metal layer 23, the first laminated structure body 20, the second laminated structure body 30, and the cap layer 34 are consecutively deposited on the entire surface. Next, the cap layer 34, the second laminated structure body 30, the first laminated structure body 20, and the metal layer 23 are etched by a reactive ion etching method (RIE method). The metal layer 23 is brought into contact with the connection hole 66. It should be noted that the intermediate layer 32 formed of a magnesium oxide (MgO) was formed by depositing an MgO layer by an RF magnetron sputtering method. Further, the other layers were deposited by a DC magnetron sputtering method.

[Process-120]

Next, the insulating material layer 51 is formed on the entire surface and is subjected to planarization processing. Thus, the top surface of the insulating material layer 51 is made flush with the top surface of the cap layer 34. Subsequently, the second wire 42 to be brought into contact with the cap layer 34 is formed on the insulating material layer 51. Thus, a magnetoresistive element of the structure shown in FIG. 2A (specifically, spin injection-type magnetoresistive effect element) can be obtained. It should be noted that, instead of patterning each layer by the RIE method, each layer can be patterned by an ion milling method (ion beam etching method).

As described above, for the manufacturing of the magnetoresistive element of Embodiment 1, a general MOS manufacturing process can be applied, and the magnetoresistive element can be applied as a general-purpose memory.

Incidentally, information is defined by the orientation of the magnetization direction of the storage layer 33 having uniaxial anisotropy. Information is written by supplying a magnetization inversion current (spin polarization current) in the lamination direction of the second laminated structure body 30 to cause a spin torque magnetization inversion. Hereinafter, a spin torque magnetization inversion will be simply described with reference to FIG. 11A being a conceptual diagram of a spin injection-type magnetoresistive effect element to which a spin injection magnetization inversion is applied. An electron has two types of spin angular momentum. The two types of spin angular momentum are temporarily defined as an upward direction and a downward direction. A non-magnetic body includes the same number of the upward direction and the downward direction, and a ferrimagnetic material has a different number of the upward direction and the downward direction.

The directions of magnetic moment of the storage layer 33 and the reference layer 31C, which are formed of a ferrimagnetic material, are assumed to be in antiparallel to each other. In this state, information "1" is stored in the storage layer 33. It is assumed that the information "1" stored in the storage layer 33 is rewritten to "0". In this case, a magnetization inversion current (spin polarization current) is supplied from the storage layer 33 to the magnetization fixed layer 31. In other words, an electron is provided from the magnetization fixed layer 31 toward the storage layer 33. The electron that has passed through the reference layer 31C is spin polarized, i.e., the number of the upward direction is different from the number of the downward direction. If the thickness of the intermediate layer 32 is sufficiently thin and the electron reaches the storage layer 33 before the spin polarization is weakened and the state changes to a non-polarized state in a normal non-magnetic body (the number of the upward direction is the same as the number of the downward direction), the energy in the entire system is reduced because the sign of the spin polarization degree is reversed. Therefore, a part of the electrons is inverted, i.e., the direction of spin angular momentum is changed. At that time, because the total angular momentum of the system needs to be stored, reaction that is equal to the sum of the angular momentum change of the electron whose direction is changed is given to the magnetic moment in the storage layer 33. In the case where a current, i.e., the number of electrons that pass through the second laminated structure body 30 in a unit time is small, the total number of electrons whose direction is changed is also small. Thus, the angular momentum change generated in the magnetic moment in the storage layer 33 is also small. However, if a current is increased, a lot of angular momentum change can be given to the storage layer 33 in a unit time. The time change of angular momentum is a torque, and the magnetic moment of the storage layer 33 is started to be inverted if the torque exceeds a certain threshold value and becomes stable when it is rotated about 180 degrees due to the uniaxial anisotropy. In other words, inversion from the antiparallel state to the parallel state is caused, and information "0" is stored in the storage layer 33 (see the left conceptual diagram of FIG. 11A).

Next, it is assumed that the information "0" stored in the storage layer 33 is rewritten to "1". In this case, the magnetization inversion current is conversely supplied from the magnetization fixed layer 31 to the storage layer 33. In other words, electrons are provided from the storage layer 33 toward the magnetization fixed layer 31. The electron that has reached the reference layer 31C and has spin in the downward direction passes through the magnetization fixed layer 31. On the other hand, the electron having spin in the upward direction is reflected by the reference layer 31C. Additionally, when such an electron enters the storage layer 33, a torque is given to the storage layer 33, and the storage layer 33 is inverted to an antiparallel state (see the right conceptual diagram of FIG. 11A). Note that at that time, the amount of current that is necessary for causing inversion is larger than that in the case of the inversion from the antiparallel state to the parallel state. It is difficult to intuitively understand the inversion from the parallel state to the antiparallel state. However, it may be possible to think that because the magnetization direction of the reference layer 31C is fixed and is not able to be inverted, the storage layer 33 is inverted to store the angular momentum of the entire system. In such a manner, storing of information of 0/1 is performed by supplying a magnetization inversion current (spin polarization current) having not less than a certain threshold value corresponding to the polarity in the direction from the magnetization fixed layer 31 to the storage layer 33 or the opposite direction thereof.

For evaluation of the magnetoresistive element of Embodiment 1, the following evaluation samples were experimentally produced. In other words, a thermal oxide film having a thickness of 0.1 μm was formed on a surface of a silicon semiconductor substrate having a thickness of 0.725 mm, and the metal layer 23, the first laminated structure body 20, the second laminated structure body 30, and the cap layer 34 that have the specifications shown in Table 1 were formed thereon.

Figure 1B:
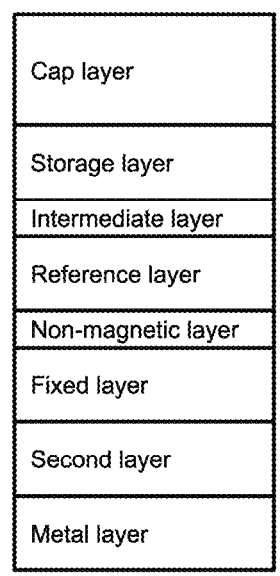

As Comparative example 1, as shown in the conceptual diagram of FIG. 1B, evaluation samples, in each of which an Ru layer having a film thickness of 5 nm (corresponding to second layer in first laminated structure body) and a Ta layer having a film thickness of 10 nm (corresponding to metal layer) are formed under the second laminated structure body 30 shown in Table 1, were experimentally produced. In other words, in Comparison example 1, a TaN layer is not formed between the Ru layer having a film thickness of 5 nm and the Ta layer having a film thickness of 10 nm.

Additionally, heat treatment was performed on the evaluation samples of Embodiment 1 and Comparison example 1 at 400° C. for 3 hours.

Figure 4A:
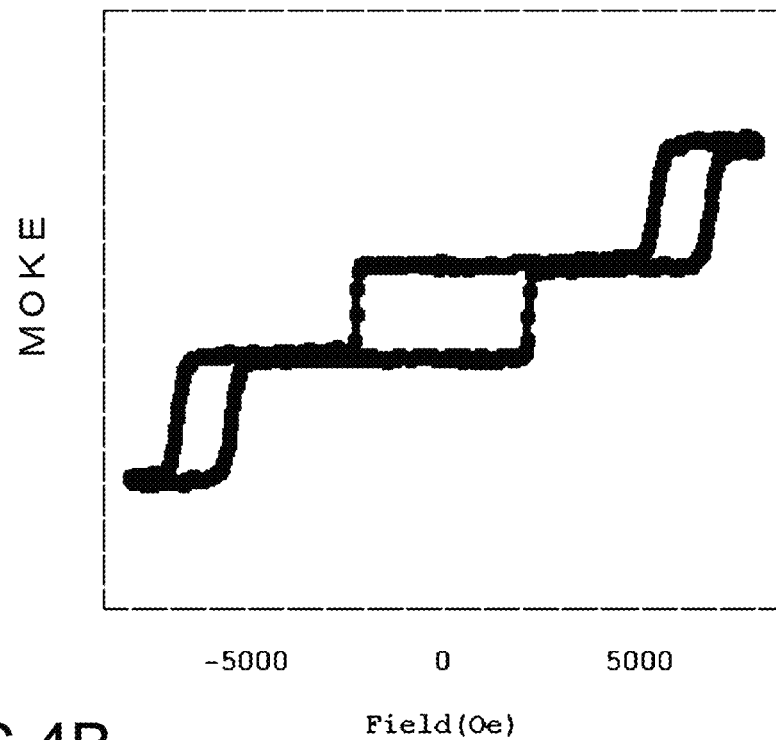
FIG. 4A and FIG. 4B are graphs showing evaluation results of magnetic properties by measurement of a magneto-optic Kerr effect, in evaluation samples of Embodiment 1 and Comparative example 1, respectively.
Figure 4B:
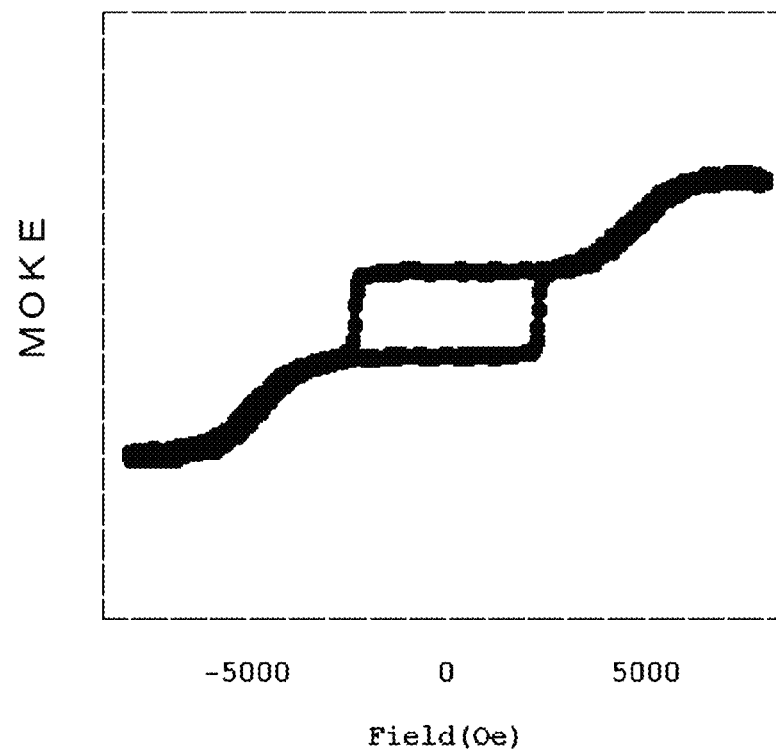

FIG. 4A and FIG. 4B show evaluation results of magnetic properties in the evaluation samples of Embodiment 1 and Comparative example 1, respectively, on the basis of measurement of a magneto-optic Kerr effect. In Comparative example 1, when heat treatment was performed at 400° C. for 3 hours, and a MOKE (magneto-optic Kerr effect) measuring apparatus was used to measure MOKE waveforms, the MOKE waveforms indicated a gentle magnetization change. Meanwhile, in Embodiment 1, the squareness of the MOKE waveforms is maintained after the heat treatment at 400° C. for 3 hours is performed.

Figure 5A:
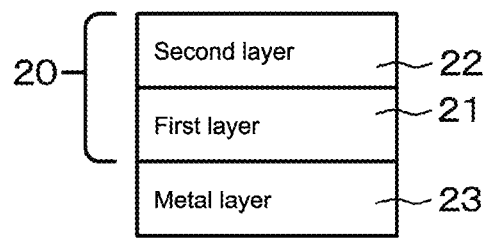
FIG. 5A and FIG. 5B are conceptual diagrams of a laminated structure of Embodiment 1 and a laminated structure of Comparative example 1, respectively.
Figure 5B:
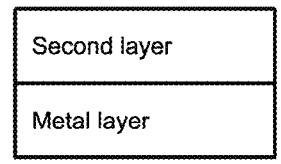
Figure 5C:
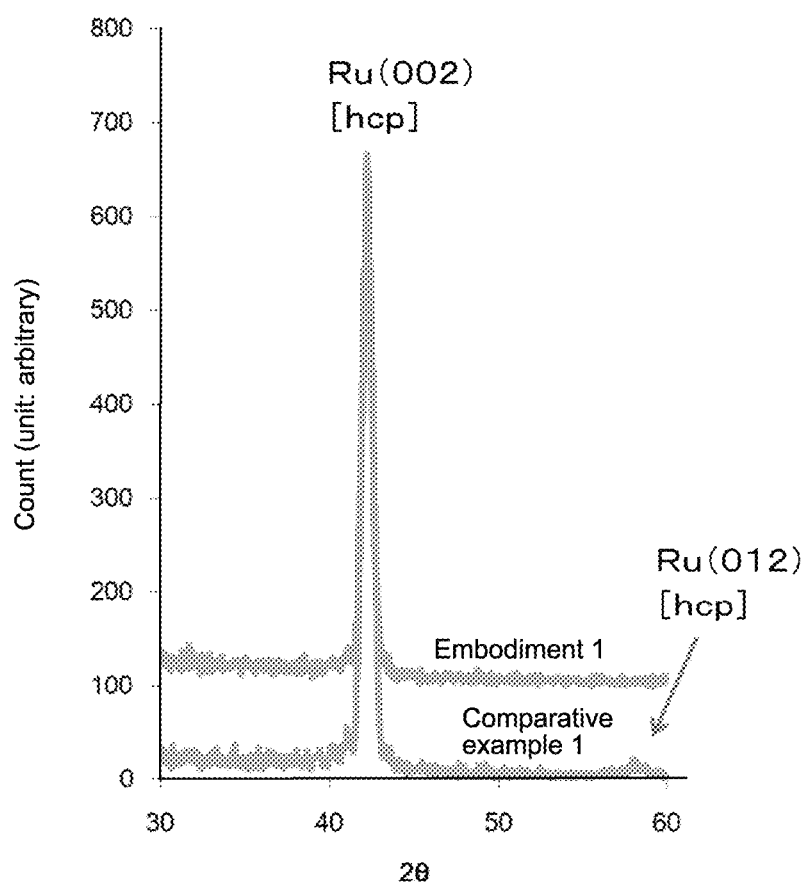
FIG. 5C is a graph showing X-ray diffraction measurement results of the laminated structure of Embodiment 1 and the laminated structure of Comparative example 1.

Next, as shown in FIG. 5A and FIG. 5B, the laminated structure of the metal layer 23 and the first laminated structure body 20 indicated by Table 1 (referred to as "laminated structure of Embodiment 1") and the laminated structure of the Ta layer having a film thickness of 5 nm and the Ru layer having a film thickness of 10 nm (referred to as "laminated structure of Comparative example 1") were experimentally produced and an X-ray diffraction (XRD) measurement was performed thereon. FIG. 5C shows XRD measurement results, in which a diffraction peak was observed in only the Ru (002) plane in the laminated structure of Embodiment 1. Meanwhile, in the laminated structure of Comparative example 1, diffraction peaks were present in not only the Ru (002) plane but also the Ru (012) plane. In other words, the following expression is satisfied: B/A≤0.05, where a value of a diffraction peak intensity of the (002) plane is A, and a value of a diffraction peak intensity of the (012) plane is B, those values being obtained on the basis of an X-ray diffraction method for the second layer 21 of the first laminated structure body 20. Specifically, in Embodiment 1, the value of B/A has a trace level, and in Comparative example 1, B/A=0.1. From those results, it was able to be determined that the laminated structure of Embodiment 1 has a highly-oriented Ru layer, that is, the laminated structure of Embodiment 1 has more optimal flatness, with the result that when the second laminated structure body 30 is formed on the laminated structure of Embodiment 1, the second laminated structure body 30 has optimal characteristics, thus obtaining stable magnetic properties to a higher temperature.

As described above, the magnetoresistive element of Embodiment 1 includes the second laminated structure body having a laminated structure of the first layer made of a metal nitride and the second layer made of ruthenium or a ruthenium compound. Here, due to the presence of the first layer made of a metal nitride, the second layer formed thereon becomes thermally stable, and thus high orientation can be maintained and optimal flatness can be imparted to the second layer. Therefore, the magnetic anisotropy of the magnetization fixed layer to be formed on the second layer is enhanced, and also high heat resistance can be imparted to the magnetoresistive element. In other words, even when being exposed to a high thermal load, the magnetization fixed layer exhibits good magnetic properties and can also maintain the good magnetic properties. Additionally, this eliminates operation errors, and thus a magnetoresistive element having a high operation margin can be provided. Further, the spin injection efficiency can be maintained large, with the result that the magnetization inversion current (spin polarization current) can be reduced. Further, the separation of the resistance value can also be maintained large, and thus the operation speed can also be accelerated.

It was determined that high heat resistance can be imparted to the magnetoresistive element also in (VN, V), (CrN, Cr), (NbN, Nb), (MoN, Mo), (WN, W), (CuN, Cu), or (TiN, Ti), other than (TaN, Ta), as a combination of (a material forming the first layer and a material forming the metal layer).

Embodiment 2

Figure 6A:
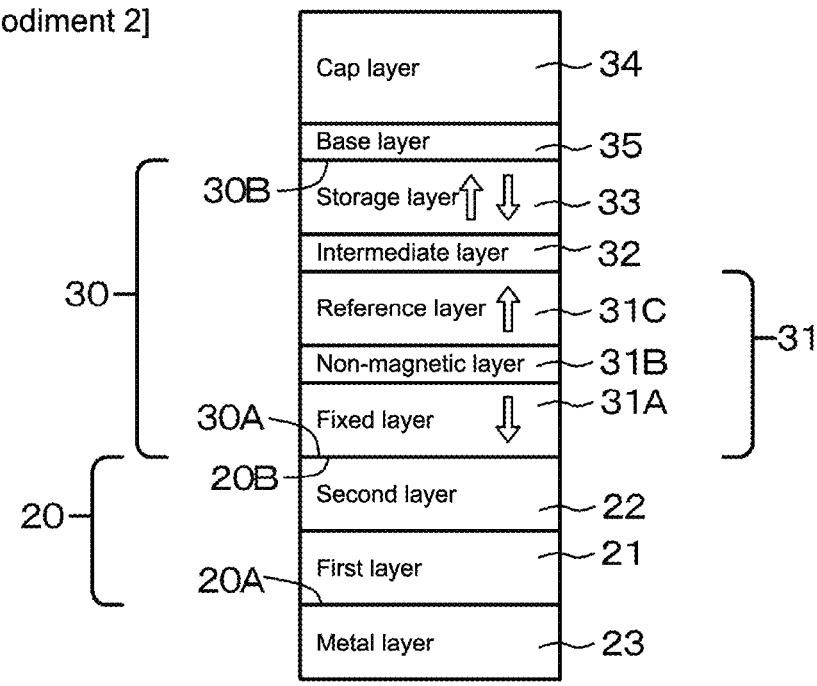
FIG. 6A and FIG. 6B are conceptual diagrams of magnetoresistive elements of Embodiment 2 and Comparative example 2, respectively.
Figure 6B:
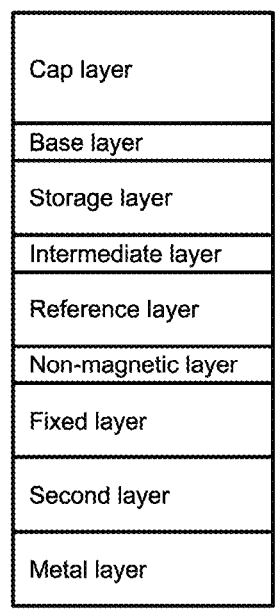

Embodiment 2 is a modified example of Embodiment 1. FIG. 6A and FIG. 6B show conceptual diagrams of magnetoresistive elements of Embodiment 2 and Comparative example 2, respectively. It should be noted that, in Embodiment 2 as well, for evaluation of the magnetoresistive element, the following evaluation samples were experimentally produced. In other words, a thermal oxide film having a thickness of 0.3 μm (not shown) was formed on a surface of a silicon semiconductor substrate having a thickness of 0.725 mm, and the metal layer 23, the first laminated structure body 20, the second laminated structure body 30, the cap layer 34, and the like that have the specifications shown in Table 2 below were formed thereon. Further, a measurement electrode formed of, from the bottom, a Ta layer of 3 nm/CuN layer of 10 nm/Ta layer of 3 nm/CuN layer of 10 nm/Ta layer was formed on the thermal oxide film.

TABLE 2

| | |
|---|---|
| Cap layer 34 | Laminate of Ta layer with film thickness of 1 nm and Ru layer with film thickness of 5 nm |
| Base film 35 | Ta layer with film thickness of 3 nm |
| Second laminated structure 30 | |
| Storage layer 33 | $(Co_{20}Fe_{80})_{80}B_{20}$ layer with film thickness of 1.6 nm |
| Intermediate layer 32 | MgO layer with film thickness of 1.0 nm |
| Magnetization fixed layer 31 | |
| Reference layer 31C | $(Co_{20}Fe_{80})_{80}B_{20}$ layer with film thickness of 1.0 nm |
| Non-magnetic layer 31B | Ru layer with film thickness of 0.8 nm |
| Fixed layer 31A | Co—Pt alloy layer with film thickness of 2.5 nm |
| First laminated structure 20 | |
| Second layer 22 | Ru layer with film thickness of 5 nm |
| First layer 21 | TaN layer with film thickness of 5 nm |
| Metal layer 23 | Ta layer with film thickness of 5 nm |

As Comparative example 2, evaluation samples, in each of which an Ru layer having a film thickness of 5 nm (corresponding to second layer in first laminated structure body) and a Ta layer having a film thickness of 10 nm (corresponding to metal layer) are formed under the second laminated structure body 30 shown in Table 2 as in the Comparative example 1, were experimentally produced. In other words, also in Comparison example 2, a TaN layer is not formed between the Ru layer having a film thickness of 5 nm and the Ta layer having a film thickness of 10 nm.

Additionally, using a CIPT (Current In Plant Tunneling) apparatus, RA characteristics (resistance component in a direction parallel to the lamination direction of the second laminated structure body 30, i.e., product of the resistance value and the area, whose unit is $\Omega \cdot \mu m^2$), and TMR characteristics (resistance change ratio, whose unit is %) were measured.

The following Table 3 shows measurement results of the RA characteristics and the TMR characteristics of the evaluation samples of Embodiment 2 and Comparative example 2. It should be noted that two types of heat treatment, i.e., heat treatment at 350° C. for 1 hour and heat treatment at 400° C. for 3 hours were performed.

TABLE 3

|  | Heat treatment of 350° C. × 1 hour | Heat treatment of 400° C. × 3 hours |
|---|---|---|
| RA characteristics | | |
| Embodiment 2 | 7 | 7 |
| Comparative example 2 | 7 | 8.5 |
| TMR characteristics | | |
| Embodiment 2 | 125 | 155 |
| Comparative example 2 | 125 | 120 |

As a result of the measurement, in the heat treatment at 350° C. for 1 hour, in both Embodiment 2 and Comparative example 2, the value of the RA characteristics was 7 $\Omega\cdot\mu^2$, and the value of the TMR characteristics was 125%. However, in the heat treatment at 400° C. for 3 hours, the RA characteristics and the TMR characteristics were different in response to the presence/absence of deterioration of the magnetic properties. In other words, the evaluation samples of Comparative example 2 in which the magnetic properties deteriorate resulted in that the value of the RA characteristics increases and the value of the TMR characteristics decreases. In contrast to this, in Embodiment 2, the value of the RA characteristics did not change and the value of the TMR characteristics increased to 155%. Such an increase in value of the TMR characteristics probably results from the progress of crystallization of the Co—Fe—B alloy layer or MgO layer due to the rise of the heat treatment temperature.

Embodiment 3

Embodiment 3 relates to an electronic device including the magnetoresistive element described in Embodiment 1 to Embodiment 2, specifically, to a magnetic head. The magnetic head can be applied to, for example, various electronic apparatuses, electric apparatuses, and the like including a hard disk drive, an integrated circuit chip, a personal computer, a portable terminal, a mobile phone, and a magnetic sensor device.

Figure 10A:
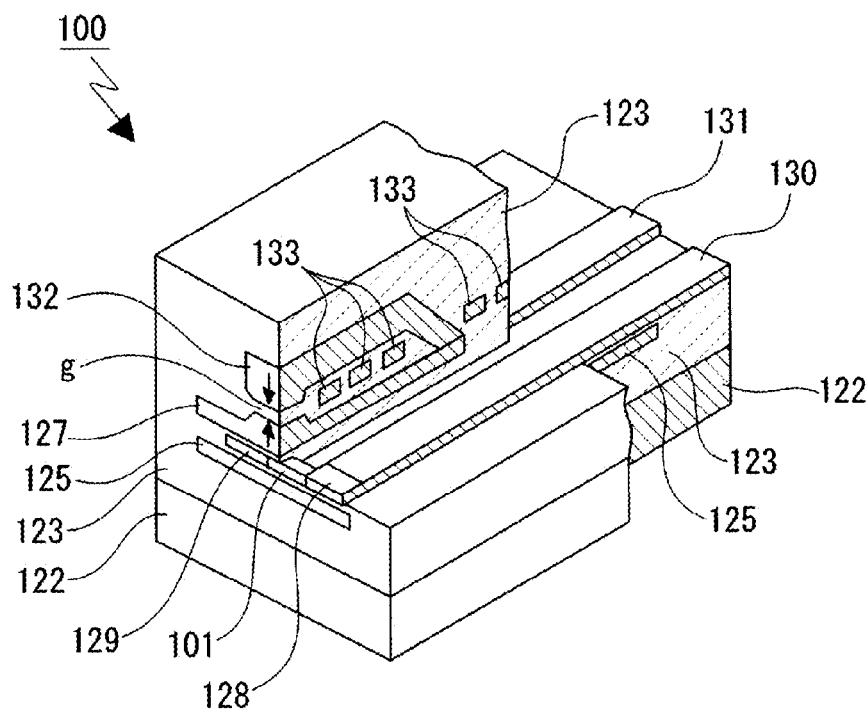
FIG. 10A and FIG. 10B are a partially cut-away schematic perspective view of a composite magnetic head of Embodiment 3, and a schematic cross-sectional view of the composite magnetic head of Embodiment 3.
Figure 10B:
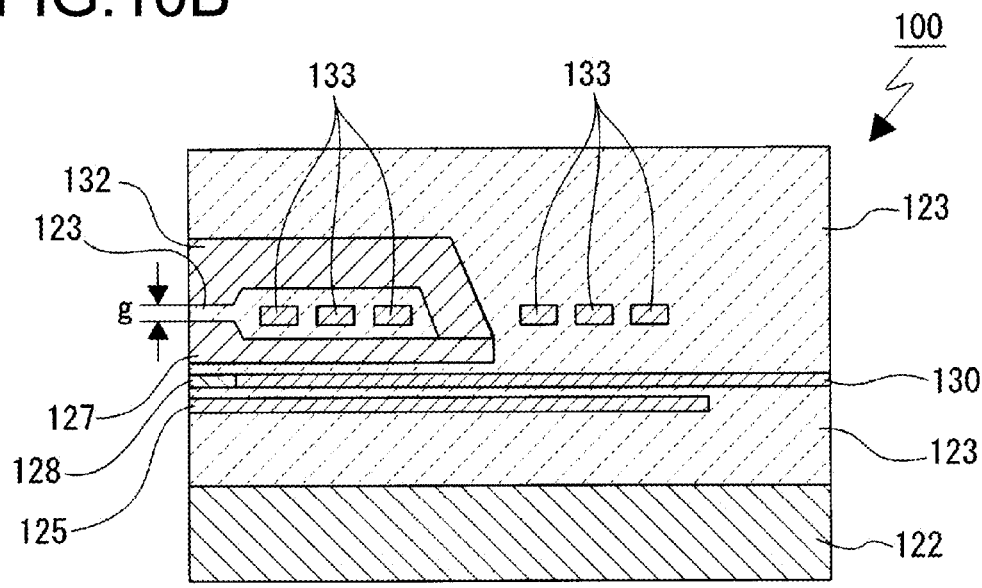

As an example, FIGS. 10A and 10B show an example in which a magnetoresistive element 101 is applied to a composite magnetic head 100. It should be noted that FIG. 10A is a partially cut-away schematic perspective view illustrating the internal structure of the composite magnetic head 100, and FIG. 10B is a schematic cross-sectional view of the composite magnetic head 100.

The composite magnetic head 100 is a magnetic head to be used in a hard disk apparatus or the like, and includes, on a substrate 122, a magnetoresistive effect type magnetic head including the magnetoresistive element described in each of Embodiment 1 to Embodiment 2. Further, an inductive type magnetic head is laminated on the magnetoresistive effect type magnetic head. Here, the magnetoresistive effect type magnetic head operates as a playback head, whereas the inductive type magnetic head operates as a recording head. In other words, the composite magnetic head 100 is formed by combining a playback head and a recording head.

The magnetoresistive effect type magnetic head that is mounted on the composite magnetic head 100 is a so-called shield type MR head, and includes a first magnetic shield layer 125 formed on the substrate 122 via an insulating layer 123, the magnetoresistive element 101 formed on the first magnetic shield layer 125 via the insulating layer 123, and a second magnetic shield layer 127 formed on the magnetoresistive element 101 via the insulating layer 123. The insulating layer 123 is formed of an insulating material such as $Al_2O_3$ or $SiO_2$. The first magnetic shield layer 125 magnetically shields the lower layer side of the magnetoresistive element 101 and is formed of a soft magnetic material such as Ni—Fe. On the first magnetic shield layer 125, the magnetoresistive element 101 is formed via the insulating layer 123. The magnetoresistive element 101 functions, in the magnetoresistive effect type magnetic head, as a magneto-sensitive element that detects a magnetic signal from a magnetic recording medium. The magnetoresistive element 101 is formed in a substantially square shape, one side surface of which is exposed as a surface that faces the magnetic recording medium. Additionally, bias layers 128 and 129 are provided on both ends of the magnetoresistive element 101. Further, connection terminals 130, 131 that are connected to the bias layers 128 and 129 are formed. A sense current is supplied to the magnetoresistive element 101 via the connection terminals 130, 131. Above the bias layers 128 and 129, the second magnetic shield layer 127 is provided via the insulating layer 123.

The inductive type magnetic head that is laminated on the magnetoresistive effect type magnetic head includes a magnetic core and a thin-film coil 133. The magnetic core is formed of the second magnetic shield layer 127 and an upper core 132. The thin-film coil 133 is formed to be wound around the magnetic core. The upper core 132 forms a closed magnetic path together with the second magnetic shield layer 127 to form the magnetic core of the inductive type magnetic head, and is formed of a soft magnetic material such as Ni—Fe. Here, the second magnetic shield layer 127 and the upper core 132 are formed such that the front end portions thereof are exposed as the surfaces facing the magnetic recording medium, and the second magnetic shield layer 127 and the upper core 132 are in contact with each other at the rear end portions thereof. Here, the front end portions of the second magnetic shield layer 127 and the upper core 132 are formed such that, in the surfaces facing the magnetic recording medium, the second magnetic shield layer 127 and the upper core 132 are separated from each other with a predetermined gap g. In other words, in the composite magnetic head 100, the second magnetic shield layer 127 is configured to not only magnetically shield the upper layer side of the magnetoresistive element 101 but also serve as the magnetic core of the inductive type magnetic head, and the second magnetic shield layer 127 and the upper core 132 form the magnetic core of the inductive type magnetic head. Moreover, the gap g serves as a magnetic gap for recording of the inductive type magnetic head.

Further, the thin-film coil 133 that is embedded in the insulating layer 123 is formed on the second magnetic shield layer 127. The thin-film coil 133 is formed to be wound around the magnetic core formed of the second magnetic shield layer 127 and the upper core 132. Although not illustrated, both end portions of the thin-film coil 133 are exposed to the outside, and terminals that are formed on the both ends of the thin-film coil 133 become terminals for external connection of the inductive type magnetic head. In other words, in recording of a magnetic signal on the magnetic recording medium, the recording current is supplied to the thin-film coil 133 from those terminals for external connection.

The composite magnetic head 100 as described above incorporates the magnetoresistive effect type magnetic head as a playback head. The magnetoresistive effect type magnetic head includes, as a magneto-sensitive element that detects a magnetic signal from the magnetic recording medium, the magnetoresistive element 101 described in each of Embodiment 1 to Embodiment 2. Additionally, since the magnetoresistive element 101 exhibits very excellent characteristics as described above, the magnetoresistive effect type magnetic head can support a further increase in recording density of magnetic recording.

Hereinabove, the present disclosure has been described on the basis of the favorable embodiments, but the present disclosure is not limited to those embodiments. The various laminated structures, the materials used, and the like that have been described in the embodiments are examples and can be appropriately changed.

Figure 7:
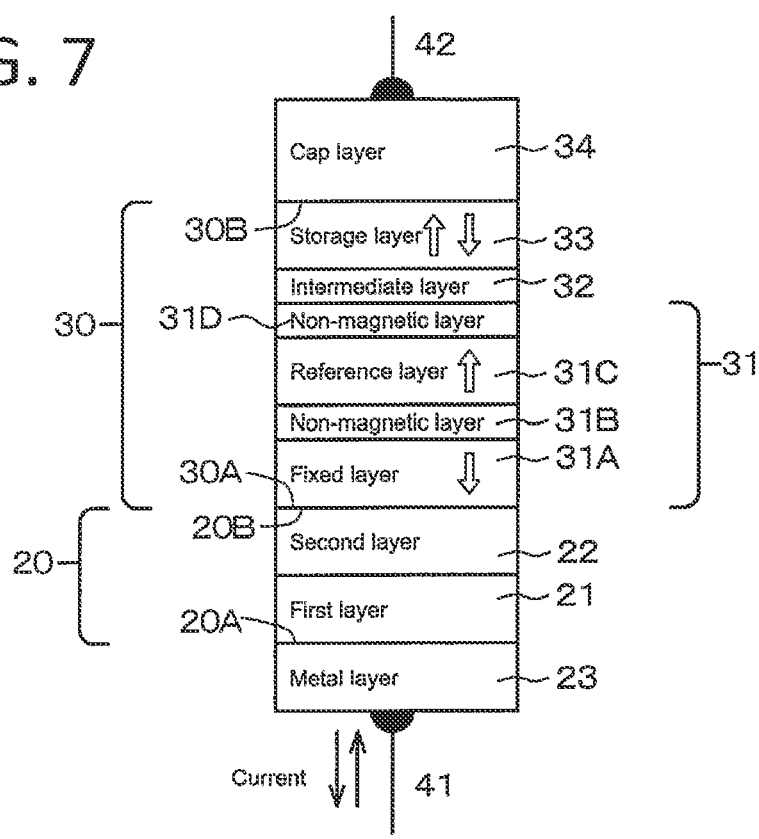
FIG. 7 is a conceptual diagram of a modified example of the magnetoresistive element of Embodiment 1.

As shown in a conceptual diagram of FIG. 7 showing a modified example of the magnetoresistive element of Embodiment 1, the laminated ferrimagnetic structure may further include a non-magnetic material layer 31D including at least one type of element selected from the group consisting of vanadium, chromium, niobium, molybdenum, tantalum, tungsten, hafnium, zirconium, titanium, and ruthenium, between the one magnetic material layer (reference layer) 31C forming the laminated ferrimagnetic structure and the second laminated structure body.

Figure 8:
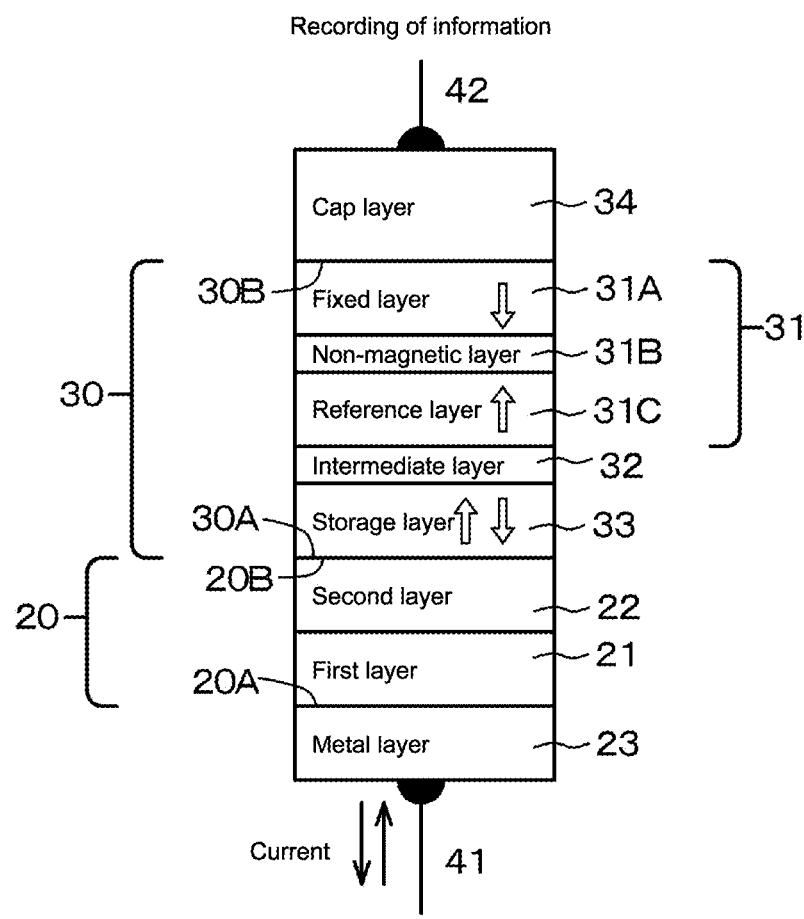
FIG. 8 is a conceptual diagram of another modified example of the magnetoresistive element of Embodiment 1.

Further, in each embodiment, the spin injection-type magnetoresistive effect element having a structure in which the storage layer 33 is positioned on the uppermost layer of the second laminated structure body 30 has been described. However, as shown in a conceptual diagram of FIG. 8, the lamination order of the layers of the second laminated structure body 30 may be inverted to provide a spin injection-type magnetoresistive effect element having a structure in which the storage layer 33 is positioned on the lowermost layer in the second laminated structure body 30. In other words, the form in which the storage layer 33 is positioned on the first surface side of the second laminated structure body 30, specifically, a structure in which the first layer 21 made of a metal nitride/the second layer 22 made of ruthenium or a ruthenium compound/the storage layer 33/the intermediate layer 32/the magnetization fixed layer 31 are laminated can be provided.

Figure 9:
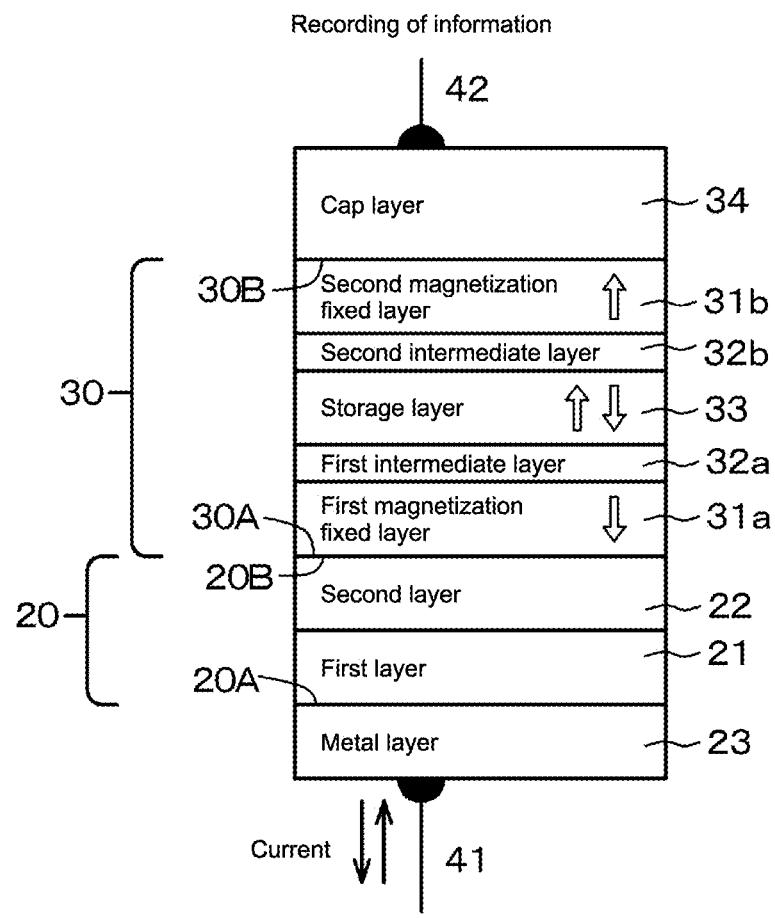
FIG. 9 is a conceptual diagram of still another modified example of the magnetoresistive element of Embodiment 1.

Alternatively, as shown in a conceptual diagram of FIG. 9, a structure in which the first layer 21 made of a metal nitride/the second layer 22 made of ruthenium or a ruthenium compound/a first magnetization fixed layer 31a/a first intermediate layer 32a/the storage layer 33/a second intermediate layer 32b/a second magnetization fixed layer 31b are laminated can also be provided. In such a structure, the two intermediate layers 32a, 32b positioned on the top and bottom of the storage layer 33 only need to be different from each other in change of magnetoresistance.

Further, the insulating material layer 51 can have magnetic properties. In this case, the insulating material layer 51 only needs to be formed of an iron oxide ($FeO_X$), for example.

Further, a so-called cross-point type memory cell unit including a plurality of magnetoresistive elements (memory elements, nonvolatile memory cells) can also be provided. This cross-point type memory cell unit includes: a plurality of first wires (word lines) extending in a first direction; a plurality of second wires (bit lines) disposed separately from the first wires in a vertical direction and extending in a second direction different from that of the first wires; and a magnetoresistive element (memory element, nonvolatile memory cell) disposed in a region where the first wires and the second wires overlap each other and connected to the first wires and the second wires. Additionally, according to the orientation of a voltage to be applied between the first wires and the second wires or the orientation of a current to be supplied between the first wires and the second wires, information is written or deleted in the magnetoresistive element. It should be noted that the selection transistor TR is unnecessary in such a structure.

It should be noted that the present disclosure can take the following configurations.

[A01] <Magnetoresistive Element>

A magnetoresistive element, including:

a first laminated structure body having a first surface and a second surface facing the first surface; and a second laminated structure body formed by laminating a storage layer, an intermediate layer, and a magnetization fixed layer, the second laminated structure body having a first surface and a second surface facing the first surface, the first surface being positioned facing the second surface of the first laminated structure body, the first laminated structure body having a laminated structure including, from the first surface side of the first laminated structure body, a first layer made of a metal nitride and a second layer made of ruthenium or a ruthenium compound.

[A02] The magnetoresistive element according to [A01], in which the magnetization fixed layer is positioned on the first surface side of the second laminated structure body.

[A03] The magnetoresistive element according to [A01] or [A02], further including a metal layer formed in contact with the first surface of the first laminated structure body.

[A04] The magnetoresistive element according to [A03], in which the first layer of the first laminated structure body and the metal layer include an identical metal element.

[A05] The magnetoresistive element according to [A04], in which a combination of (a material forming the first layer and a material forming the metal layer) is (VN, V), (CrN, Cr), (NbN, Nb), (MoN, Mo), (TaN, Ta), (WN, W), (CuN, Cu), or (TiN, Ti).

[A06] The magnetoresistive element according to any one of [A01] to [A05], in which the ruthenium compound includes at least one type of element or an element group selected from the group consisting of titanium, zirconium, hafnium, nickel, copper, chromium, nickel-iron, nickel-iron-chromium, and nickel-chromium.

[A07] The magnetoresistive element according to any one of [A01] to [A06], in which the magnetization fixed layer has a laminated ferrimagnetic structure including at least two laminated magnetic material layers.

[A08] The magnetoresistive element according to [A07], in which one of the magnetic material layers forming the laminated ferrimagnetic structure includes at least one type of element selected from the group consisting of iron, cobalt, and nickel, or includes at least one type of element selected from the group consisting of iron, cobalt, and nickel, and boron, and another one of the magnetic material layers forming the laminated ferrimagnetic structure is formed of a material including, as main components, at least one type of element selected from the group consisting of iron, cobalt, and nickel and at least one type of element selected from the group consisting of platinum, palladium, nickel, and rhodium.

[A09] The magnetoresistive element according to [A07] or [A08], in which the laminated ferrimagnetic structure further includes, between the one magnetic material layer forming the laminated ferrimagnetic structure and the second laminated structure body, a non-magnetic material layer including at least one type of element selected from the group consisting of vanadium, chromium, niobium, molybdenum, tantalum, tungsten, hafnium, zirconium, titanium, and ruthenium.

[A10] The magnetoresistive element according to any one of [A01] to [A09], in which the storage layer is formed of a metal material made of cobalt, iron, and nickel or formed of a metal material made of cobalt, iron, nickel, and boron.

[A11] The magnetoresistive element according to any one of [A01] to [A10], in which the intermediate layer is made of MgO.

[A12] The magnetoresistive element according to any one of [A01] to [A11], further including a cap layer formed in contact with the second surface of the second laminated structure body.

[A13] The magnetoresistive element according to [A12], in which the cap layer has a single-layer structure including at least one type of material selected from the group consisting of hafnium, tantalum, tungsten, zirconium, niobium, molybdenum, titanium, vanadium, chromium, magnesium, ruthenium, rhodium, palladium, and platinum, or a laminated structure including at least one type of material layer selected from the group consisting of hafnium, tantalum, tungsten, zirconium, niobium, molybdenum, titanium, vanadium, chromium, ruthenium, rhodium, palladium, and platinum, and at least one type of oxide layer selected from the group consisting of MgTiO, MgO, AlO, and SiO.

[A14] The magnetoresistive element according to any one of [A01] to [A13], in which a magnetization direction of the storage layer changes depending on information to be stored, and an easy axis of magnetization of the storage layer is parallel to a lamination direction of the second laminated structure body.

[A15] The magnetoresistive element according to [A14], in which the magnetoresistive element is a spin injection-type magnetoresistive effect element of a perpendicular magnetization method.

[A16] The magnetoresistive element according to [A14] or [A15], in which the first surface of the first laminated structure body is connected to a first wire, and the second surface of the second laminated structure body is connected to a second wire, and information is to be stored in the storage layer when a current is supplied between the first wire and the second wire.

[A17] The magnetoresistive element according to any one of [A01] to [A16], in which the following expression is satisfied:

$B/A \leq 0.05$, where a value of a diffraction peak intensity of a (002) plane is A, and a value of a diffraction peak intensity of a (012) plane is B, the values being obtained on the basis of an X-ray diffraction method for the second layer of the first laminated structure body.

[B01] <Electronic Device>

An electronic device, including the magnetoresistive element according to any one of [A01] to [A17].

REFERENCE SIGNS LIST 10 magnetoresistive element
20 first laminated structure body
20A first surface of first laminated structure body
20B second surface of first laminated structure body
21 first layer of first laminated structure body
22 second layer of first laminated structure body
23 metal layer
30 second laminated structure body
30A first surface of second laminated structure body
30B second surface of second laminated structure body
31, 31a, 31b magnetization fixed layer
31A another magnetic material layer forming laminated ferrimagnetic structure (fixed layer)
31B non-magnetic layer
31C one magnetic material layer forming laminated ferrimagnetic structure (reference layer)
31D non-magnetic material layer forming laminated ferrimagnetic structure
32, 32a, 32b intermediate layer
33 storage layer
34 cap layer
35 base layer
41 first wire
42 second wire
51 insulating material layer
60 semiconductor substrate
60A element isolation region
61 gate electrode
62 gate insulating layer
63 channel forming region
64A, 64B source/drain region
65 tungsten plug
66 connection hole
67, 68 interlayer insulating layer
100 composite magnetic head
101 magnetoresistive element
122 substrate
123 insulating layer
125 first magnetic shield layer
127 second magnetic shield layer
128, 129 bias layer
130, 131 connection terminal
132 upper core
133 thin-film coil
TR selection transistor

What is claimed is:

1. A magnetoresistive element, comprising:
a first laminated structure body having a first surface and a second surface facing the first surface, wherein the first laminated structure body is formed of a first layer of a metal nitride and a second layer of ruthenium or a ruthenium compound;
a second laminated structure body formed of a storage layer, an intermediate layer, and a magnetization fixed layer, the second laminated structure body having a first surface and a second surface facing the first surface, the first surface of the second laminated structure being positioned facing the second surface of the first laminated structure body;
a first and second interlayer insulating layer, wherein the second interlayer insulating layer covers the first interlayer insulating layer;

a connection hole formed in the first and second interlayer insulating layer, wherein the first and second laminated structure body are stacked on top of the connection hole, wherein the connection hole has a rectangular shape, and wherein the connection hole electrically connects the first laminated structure body to a selection transistor;

an insulating material layer that surrounds the first laminated structure body and the second laminated structure body, wherein the insulating material layer is formed on the second interlayer insulating layer, wherein the magnetoresistive element has a cylindrical shape; and a metal layer formed in contact with the first surface of the first laminated structure body, wherein the first layer of the first laminated structure body and the metal layer include an identical metal element.

2. The magnetoresistive element according to claim 1, wherein the magnetization fixed layer is positioned on the first surface side of the second laminated structure body.

3. The magnetoresistive element according to claim 1, wherein a combination of (a material forming the first layer and a material forming the metal layer) is (VN, V), (CrN, Cr), (NbN, Nb), (MoN, Mo), (TaN, Ta), (WN, W), (CuN, Cu), or (TiN, Ti).

4. The magnetoresistive element according to claim 1, wherein the ruthenium compound includes at least one type of element or an element group selected from: titanium, zirconium, hafnium, nickel, copper, chromium, nickel-iron, nickel-iron-chromium, and nickel-chromium.

5. The magnetoresistive element according to claim 1, wherein the magnetization fixed layer has a laminated ferrimagnetic structure including at least two laminated magnetic material layers.

6. The magnetoresistive element according to claim 5, wherein
one laminated magnetic material layer forming the laminated ferrimagnetic structure includes at least one type of element selected from: iron, cobalt, and nickel, or includes at least one type of element selected from: iron, cobalt, and nickel, and boron, and
another laminated magnetic material layer forming the laminated ferrimagnetic structure is formed of a material including, as main components, at least one type of element selected from: iron, cobalt, and nickel and at least one type of element selected from: platinum, palladium, nickel, and rhodium.

7. The magnetoresistive element according to claim 5, wherein the laminated ferrimagnetic structure further includes, between one laminated magnetic material layer forming the laminated ferrimagnetic structure and the second laminated structure body, a non-magnetic material layer including at least one type of element selected from: vanadium, chromium, niobium, molybdenum, tantalum, tungsten, hafnium, zirconium, titanium, and ruthenium.

8. The magnetoresistive element according to claim 1, wherein the storage layer is formed of a metal material made of cobalt, iron, and nickel or formed of a metal material made of cobalt, iron, nickel, and boron.

9. The magnetoresistive element according to claim 1, wherein the intermediate layer is made of MgO.

10. The magnetoresistive element according to claim 1, further comprising a cap layer formed in contact with the second surface of the second laminated structure body.

11. The magnetoresistive element according to claim 10, wherein
the cap layer has a single-layer structure including at least one type of material selected from: hafnium, tantalum, tungsten, zirconium, niobium, molybdenum, titanium, vanadium, chromium, magnesium, ruthenium, rhodium, palladium, and platinum, or a laminated structure including at least one type of material layer selected from: hafnium, tantalum, tungsten, zirconium, niobium, molybdenum, titanium, vanadium, chromium, ruthenium, rhodium, palladium, and platinum, and at least one type of oxide layer selected from the group consisting of MgTiO, MgO, AlO, and SiO.

12. The magnetoresistive element according to claim 1, wherein
a magnetization direction of the storage layer changes depending on information to be stored, and
an easy axis of magnetization of the storage layer is parallel to a lamination direction of the second laminated structure body.

13. The magnetoresistive element according to claim 12, wherein the magnetoresistive element is a spin injection-type magnetoresistive effect element of a perpendicular magnetization method.

14. The magnetoresistive element according to claim 12, wherein
the first surface of the first laminated structure body is connected to a first wire, and the second surface of the second laminated structure body is connected to a second wire, and
the information is stored in the storage layer when a current is supplied between the first wire and the second wire.

15. The magnetoresistive element according to claim 1, wherein
the following expression is satisfied:

$$B/A \leq 0.05,$$

where a value of a diffraction peak intensity of a (002) plane is A, and a value of a diffraction peak intensity of a (012) plane is B, the diffraction peak intensity values being obtained on a basis of an X-ray diffraction method for the second layer of the first laminated structure body.

16. An electronic device, comprising the magnetoresistive element according to claim 1.

* * * * *